United States Patent
Kuroda

(10) Patent No.: US 12,046,281 B2
(45) Date of Patent: Jul. 23, 2024

(54) STORAGE APPARATUS, STORAGE CONTROL APPARATUS, AND STORAGE APPARATUS CONTROL METHOD

(71) Applicant: Sony Semiconductor Solutions Corporation, Kanagawa (JP)

(72) Inventor: Masami Kuroda, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 137 days.

(21) Appl. No.: 17/780,654

(22) PCT Filed: Oct. 12, 2020

(86) PCT No.: PCT/JP2020/038450
§ 371 (c)(1),
(2) Date: May 27, 2022

(87) PCT Pub. No.: WO2021/131234
PCT Pub. Date: Jul. 1, 2021

(65) Prior Publication Data
US 2023/0007998 A1    Jan. 12, 2023

(30) Foreign Application Priority Data
Dec. 25, 2019   (JP) .................. 2019-234296

(51) Int. Cl.
*G11C 13/00* (2006.01)
*G11C 29/52* (2006.01)

(52) U.S. Cl.
CPC ........ *G11C 13/0069* (2013.01); *G11C 13/004* (2013.01); *G11C 29/52* (2013.01)

(58) Field of Classification Search
CPC .............. G11C 11/1675; G11C 13/004; G11C 13/0069; G11C 29/52; G11C 11/1655;
(Continued)

(56) References Cited

U.S. PATENT DOCUMENTS 9,348,697 B2 * 5/2016 Hoya ................. G11B 20/1833
2014/0025907 A1   1/2014 Fujinami et al.
(Continued)

FOREIGN PATENT DOCUMENTS

JP    2010-003348 A    1/2010
JP    2014-022004 A    2/2014
(Continued)

OTHER PUBLICATIONS

International Search Report issued in International Patent Application No. PCT/JP2020/038450 dated Dec. 1, 2020 and English translation of same. 5 pages.
(Continued)

*Primary Examiner* — Thong Q Le
(74) *Attorney, Agent, or Firm* — K&L Gates LLP

(57) ABSTRACT

Provided is a storage apparatus that reduces the power needed to write corrected data back to a memory.
The storage apparatus includes a memory and a write control section. The memory stores data in units of multiple cells each representing a predetermined value. The write control section receives write-back data having a specific value in a position corresponding to at least one of the multiple cells, as well as a write-back command regarding the specific value. The write control section performs control to write the specific value only to the cell corresponding to the position indicative of the specific value in the write-back data.

17 Claims, 25 Drawing Sheets

(58) Field of Classification Search
CPC . G11C 11/1693; G11C 29/44; G11C 11/1673; G11C 11/1697; G11C 13/0023; G11C 13/0038; G11C 13/0061; G11C 2013/0076; G11C 2029/0411; G11C 11/1653; G11C 11/005; G11C 11/02; G11C 11/15; G11C 11/1677; G11C 2029/1208; G11C 2207/2236; G11C 29/12; G11C 5/143; G11C 7/1051; G11C 7/1096; G11C 8/12; G11C 11/221; G11C 11/2273; G11C 11/5657; G11C 13/0033; G11C 2013/0054; G11C 2029/0409; G11C 27/024; G11C 29/42

See application file for complete search history.

(56) References Cited

U.S. PATENT DOCUMENTS

2016/0276010 A1    9/2016   Takaya et al.
2019/0377631 A1   12/2019   Hattori

FOREIGN PATENT DOCUMENTS

| JP | 2016-177853 A | 10/2016 |
| JP | 6612392 A | 11/2019 |

OTHER PUBLICATIONS

Written Opinion issued in International Patent Application No. PCT/JP2020/038450 dated Dec. 1, 2020. 5 pages.

* cited by examiner a  WRITE DATA b  READOUT DATA c  WRITE-BACK DATA

FIG.10

| WRITE-BACK BIT \ WRITE-BACK DIRECTION | 0 | 1 |
|---|---|---|
| 0 | WRITE TO BIT LINE SIDE | Hi-Z |
| 1 | Hi-Z | WRITE TO SOURCE LINE SIDE |

STORAGE APPARATUS, STORAGE CONTROL APPARATUS, AND STORAGE APPARATUS CONTROL METHOD

TECHNICAL FIELD

The present technology relates to a storage apparatus. More particularly, the technology relates to a storage apparatus, a storage control apparatus, and a storage apparatus control method for performing control to write specific values.

BACKGROUND ART

Semiconductor storage apparatuses have, as their basic constituent element, a memory array in which memory cells each capable of storing binary information of "0" or "1" are arranged lengthwise and crosswise in an array pattern. Normally, in response to a read command, each memory cell returns the correct data stored therein. In some rare cases, there occurs a soft error involving stored data in a cell being inverted. In view of this, error detection and correction circuits represented by ECC (Error Checking and Correction) circuits are used in combination with the memory array to improve data reliability. However, even if the error can be corrected by ECC, the data in the memory array is in an erroneous state. Methods have thus been proposed to correct the data error in the memory cells by rewriting the data therein (e.g., see PTL 1).

CITATION LIST

Patent Literature

[PTL 1]
  JP 2010-003348A

SUMMARY

Technical Problem

According to the above-mentioned existing technology, write-back data is constituted by multiple data bits and is assumed to be written back in a batch. However, the data bits that actually need write-back for correction are only some of the multiple data bits. For example, a storage apparatus having a resistance change memory such as an MRAM or ReRAM has its retained data inverted when a current is applied to the storage elements. Thus, when multiple data items including normal bits is written back in a batch, the current for overwriting the normal bits becomes a major source of power consumption, worsening the power loss.

The present technology has been made in view of the above circumstances. An object of the technology is therefore to reduce the power needed to write back correct data to a memory.

Solution to Problem

In solving the above problem and according to a first aspect of the present technology, there is provided a storage apparatus including a memory configured to store data in units of multiple cells each representing a predetermined value, and a write control section configured such that, upon receipt of write-back data having a specific value in a position corresponding to at least one of the multiple cells, as well as a write-back command regarding the specific value, the write control section performs control to write the specific value only to a cell corresponding to the position indicative of the specific value in the write-back data. This provides an effect that the specific value is written only to the cell corresponding to the position indicative of the specific value in the write-back data.

According to the first aspect of the present technology, each of the multiple cells may include a resistance change memory cell that stores any one of two binary values according to a resistance state of the cell.

Also, according to the first aspect of the present technology, the write control section may perform control to let a current flow only to the cell corresponding to the position indicative of the specific value in the write-back data in a direction corresponding to the specific value, the write control section further performing control to prevent a current from flowing to the other cells by fixing the other cells to ground. This provides an effect that a current is allowed to flow only to the cell corresponding to the position indicative of the specific value in the write-back data in order to write the specific value to the cell and that a current is prevented from flowing to the other cells by fixing the other cells to ground.

Also, according to the first aspect of the present technology, the write control section may perform control to let a current flow only to the cell corresponding to the position indicative of the specific value in the write-back data in a direction corresponding to the specific value, the write control section further performing control to prevent a current from flowing to the other cells by fixing the other cells to high impedance. This provides an effect that a current is allowed to flow only to the cell corresponding to the position indicative of the specific value in the write-back data in order to write the specific value to the cell and that a current is prevented from flowing to the other cells by fixing the other cells to high impedance.

Also, according to the first aspect of the present technology, the write control section may perform control to let a current flow only to the cell corresponding to the position indicative of the specific value in the write-back data in a direction corresponding to the specific value, the write control section further performing control to prevent a current from flowing to the other cells by fixing the other cells to a power level. This provides an effect that a current is allowed to flow only to the cell corresponding to the position indicative of the specific value in the write-back data in order to write the specific value to the cell and that a current is prevented from flowing to the other cells by fixing the other cells to the power level.

Also, according to the first aspect of the present technology, the write control section may be divided into a first write control section and a second write control section symmetrical to each other across the memory interposed therebetween, the first write control section may perform control to let a current flow only to the cell corresponding to the position indicative of the specific value in the write-back data in a direction corresponding to the specific value, the first write control section further performing control to prevent a current from flowing to the other cells by fixing the other cells to a power level, and the second write control section may perform control to let a current flow only to the cell corresponding to the position indicative of the specific value in the write-back data in a direction corresponding to the specific value, the second write control section further performing control to prevent a current from flowing to the other cells by fixing the other cells to ground. This provides an effect that the first and second write control sections are arranged symmetrically to each other across the memory interposed therebetween in order to align write distances to the cells therein.

Also, according to the first aspect of the present technology, the write control section may perform control to write the specific value in two cases on a time-sharing basis, one of the two cases involving one of the two binary values being the specific value, the other case involving the other of the two binary values being the specific value. This provides an effect that any one of the two binary values is written with respect to each multiple-bit error on a time-sharing basis.

Also, according to the first aspect of the present technology, the data stored in the memory may have information bits and check bits for checking the information bits. This provides an effect that an error occurring in the memory can be detected and corrected.

Also, according to the first aspect of the present technology, the storage apparatus may further include a write-back command generation section configured to generate a correction bit position and the write-back command on the basis of the information bits and the check bits in the data read from the memory. This provides an effect of carrying out write-back on the correction bit position.

Also, according to the first aspect of the present technology, the write-back command generation section may include a check circuit and a correction circuit, the check circuit generating the correction bit position by checking whether or not a bit error is included in the data read from the memory on the basis of the information bits and the check bits in the read data, the correction circuit correcting the bit error and generating the write-back command on the basis of the data read from the memory and the correction bit position. This provides an effect of correcting an error on the basis of the information bits and the check bits.

Also, according to the first aspect of the present technology, the storage apparatus may further include a write-back control section configured to generate the write-back data on the basis of the correction bit position and the write-back command. This provides an effect of designating write-back with respect to the correction bit position.

Also, according to the first aspect of the present technology, the storage apparatus may further include a write-back information holding section configured to hold the correction bit position and the write-back command as write-back information, in which the write-back control section may generate the write-back data on the basis of the write-back information held in the write-back information holding section. This provides an effect of performing read and write-back operations at independent timings.

Also, according to the first aspect of the present technology, the memory may be divided into a first memory and a second memory, the first memory may store the information bits, and the second memory may store the check bits. This provides an effect of storing the information bits and the check bits in different memories.

According to a second aspect of the present technology, there are provided a storage control apparatus and a storage apparatus control method for use therewith, the storage control apparatus including a write-back command generation section configured to generate a correction bit position and a write-back command regarding a specific value on the basis of information bits and check bits in data read from a memory, the write-back command generation section further outputting the write-back command to the memory, and a write-back control section configured to generate write-back data having the specific value in a position corresponding to at least one of multiple bits on the basis of the correction bit position and the write-back command, the write-back control section further outputting the write-back data to the memory. This provides an effect of controlling the memory in such a manner that the specific value is written only to the cell corresponding to the position indicative of the specific value in the write-back data.

According to the second aspect of the present technology, the storage control apparatus may further include a write-back information holding section configured to hold the correction bit position and the write-back command as write-back information, in which the write-back control section may generate the write-back data on the basis of the write-back information held in the write-back information holding section. This provides an effect of performing read and write-back operations at independent timings.

BRIEF DESCRIPTION OF DRAWINGS

FIG. 10 is a diagram depicting a second exemplary truth table for write control in the first embodiment of the present technology.

DESCRIPTION OF EMBODIMENTS

Some preferred embodiments (called the embodiments hereunder) for implementing the present technology are described below. The description is made in the following order:

1. First embodiment (an example in which only the bit matching the write-back direction is written back)
2. Second embodiment (an example in which the memory array is divided)
3. Third embodiment (an example in which the correction function is distributed to the storage control apparatus)
4. Fourth embodiment (an example in which read and write-back operations are performed at independent timings)
5. Fifth embodiment (an example in which the third and fourth embodiments are combined)
6. Sixth embodiment (an example in which a multiple-bit error is corrected)
7. Application examples

1. First Embodiment

[Storage Apparatus]

Figure 1:
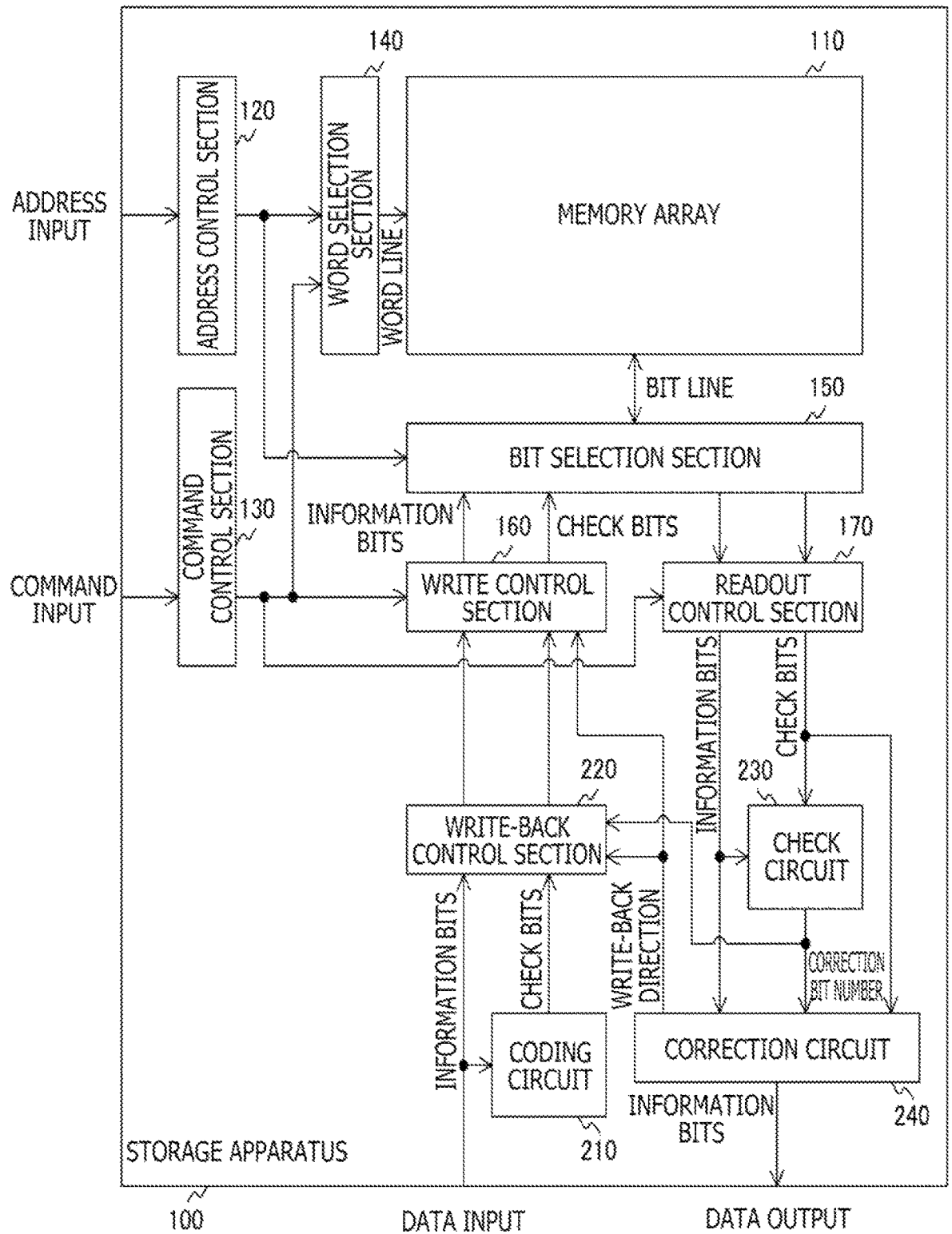
FIG. 1 is a diagram depicting an exemplary overall configuration of a storage apparatus 100 in a first embodiment of the present technology.

FIG. 1 is a diagram depicting an exemplary overall configuration of a storage apparatus 100 in a first embodiment of the present technology.

The storage apparatus 100 includes a memory array 110, an address control section 120, a command control section 130, a word selection section 140, a bit selection section 150, a write control section 160, a readout control section 170, a coding circuit 210, a write-back control section 220, a check circuit 230, and a correction circuit 240.

The memory array 110 has memory cells arranged in a two-dimensional matrix pattern (array pattern). It is assumed, for example, that the memory cells are each a resistance change memory cell that stores any one of two binary values depending on a resistance state. For example, MRAM (Magnetoresistive Random Access Memory) cells are used as the resistance change memory cells. Incidentally, the memory array 110 is an example of the memory described in the appended claims.

The address control section 120 receives input of an address from a host computer (not depicted) and, in accordance with the input address, controls the memory cells to be accessed in the memory array 110.

The command control section 130 receives input of a command from the host computer (not depicted) and, in accordance with the input command, controls writing to or reading from the memory array 110.

The word selection section 140 selects a word line in the memory array 110. The bit selection section 150 selects a bit line and a source line in the memory array 110.

The write control section 160 controls writing to the memory array 110. The readout control section 170 controls readout from the memory array 110.

The coding circuit 210 generates check codes as error correction codes for the write data input from the host computer (not depicted). In the description that follows, the write data before being coded will be referred to as the information bits and the generated check codes as the check bits.

The check circuit 230 is a circuit that checks whether or not a bit error is included in the information bits and in the check bits read from the memory array 110. In a case where a bit error is detected, the check circuit 230 outputs a correction bit number indicative of where the erroneous bit is located in the order of the read data (information bits and check bits). The correction bit number includes, for example, a bit count covering both the information bits and the check bits. A bit string is assumed in which the bit where an error is detected is "1" and the other bits are "0."

The correction circuit 240 corrects the read data (information bits and check bits) in accordance with the correction bit number output from the check circuit 230, and outputs the data corresponding to the information bits. The correction circuit 240 further outputs, to the write-back control section 220 and write control section 160, a write-back direction in which the corrected bits are written back to the memory array 110. That is, the correction circuit 240 designates whether the write-back direction is one in which the bit corresponding to the correction bit number is set to "0" or to "1." Incidentally, the check circuit 230 and the correction circuit 240 are examples of the write-back command generation section described in the appended claims.

The write-back control section 220 controls write-back to the memory array 110 in accordance with the correction bit number from the check circuit 230 and the write-back direction from the correction circuit 240.

Figure 2:
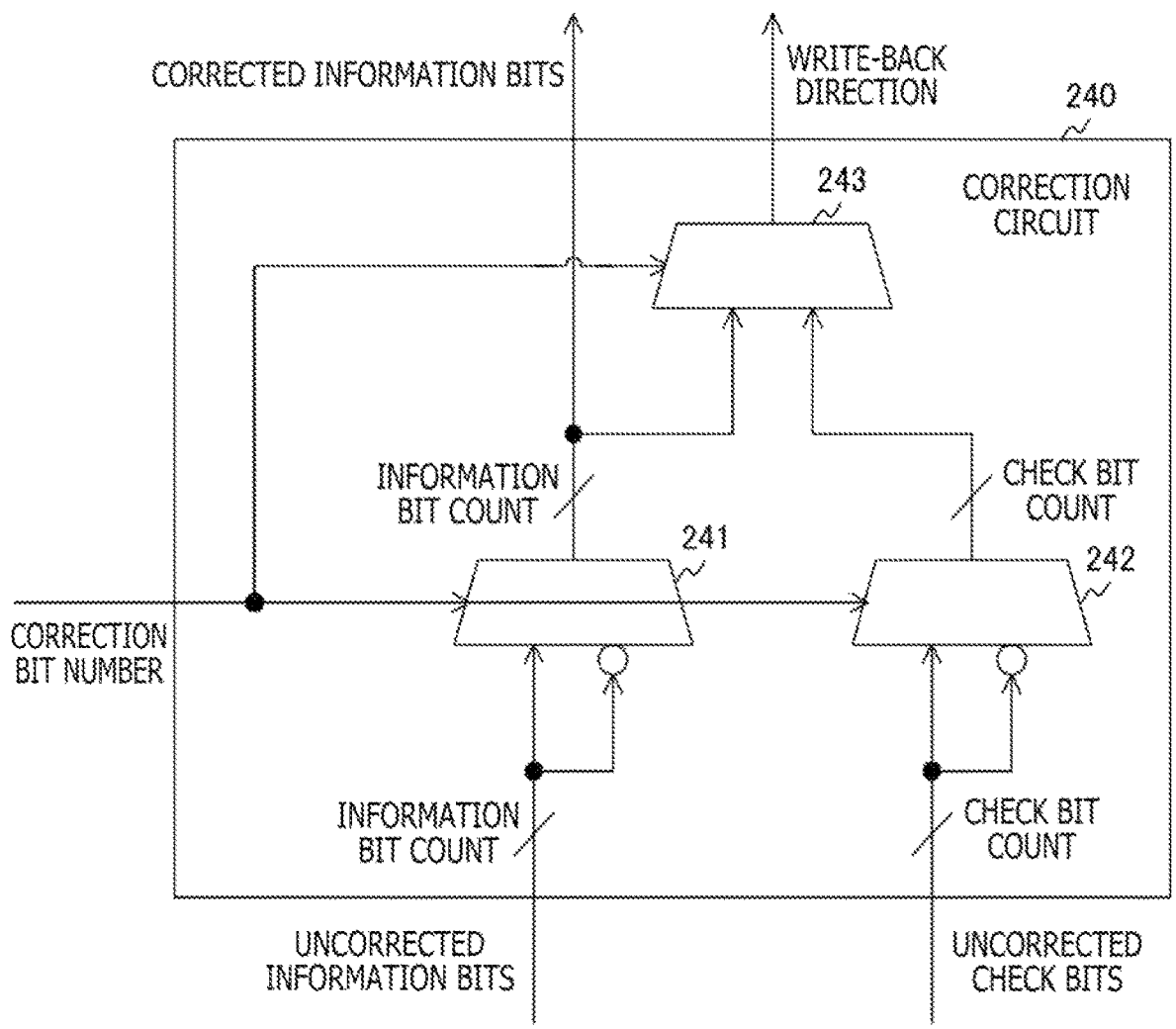
FIG. 2 is a diagram depicting an exemplary configuration of a correction circuit 240 in the first embodiment of the present technology.

FIG. 2 is a diagram depicting an exemplary configuration of the correction circuit 240 in the first embodiment of the present technology.

The correction circuit 240 includes selectors 241 through 243. The selector 241 inverts, from among the uncorrected information bits, solely the bit corresponding to the correction bit number from the check circuit 230. The output from the selector 241 is sent to the outside as the corrected information bits and is also supplied to the selector 243.

The selector 242 inverts, from among the uncorrected check bits, only the bit corresponding to the correction bit number from the check circuit 230. The output from the selector 242 is supplied to the selector 243 as the corrected check bits.

From among the corrected information bits and check bits, the selector 243 selects only the bit corresponding to the correction bit number from the check circuit 230 and outputs what is selected as the write-back direction.

Figure 3:
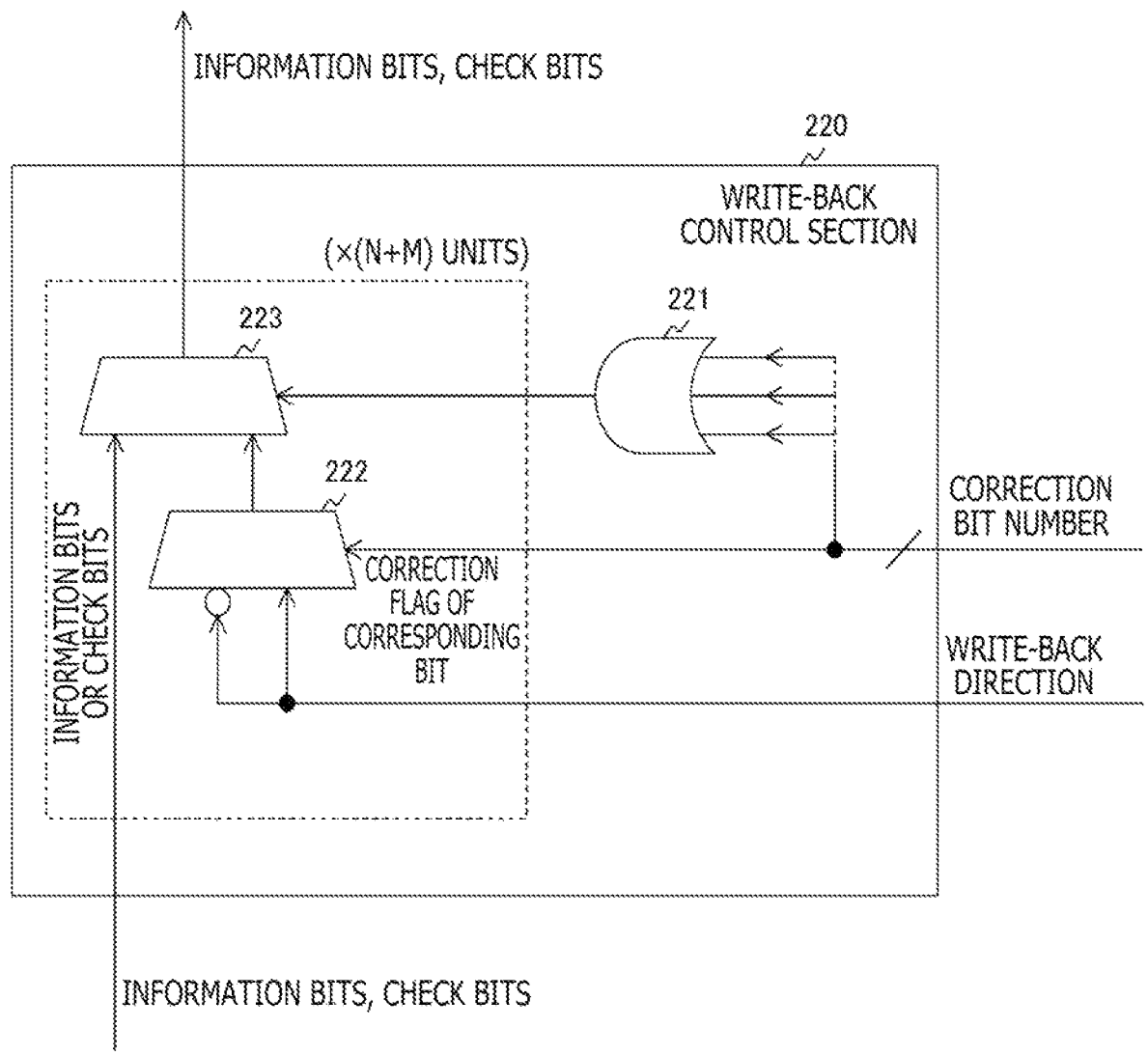
FIG. 3 is a diagram depicting an exemplary configuration of a write-back control section 220 in the first embodiment of the present technology.

FIG. 3 is a diagram depicting an exemplary configuration of the write-back control section 220 in the first embodiment of the present technology.

The write-back control section 220 includes one OR circuit 221, (N+M) selectors 222, and (N+M) selectors 223. Here, N is an integer indicative of the number of information bits, and M is an integer indicating the number of check bits. That is, the selectors 222 and 223 are provided one to one corresponding to the data bits including the information bits and check bits.

The OR circuit 221 is a circuit that generates a logical sum (OR) of the bit string of the correction bit number from the check circuit 230. That is, if an error is detected in the information bits or in the check bits, the OR circuit 221 outputs "1"; if no error is detected in the information bits or in the check bits, the OR circuit 221 outputs "0."

Regarding the bit of which the correction bit number from the check circuit 230 indicates detection of an error, the selectors 222 select the write-back direction data. Regarding the bit of which the correction bit number indicates non-detection of an error, the selectors 222 select the inverted write-back direction data.

In a case where the output from the OR circuit 221 is received and an error is detected in the information bits or in the check bits, the selectors 223 select the output from the selectors 222 and forward the output to the write control section 160. On the other hand, if no error is detected, the selectors 223 output the input data as is to the write control section 160. The data in the latter case includes the data input from the host computer (information bits) and of the check bits associated therewith.

[Write Control]

Figure 4:
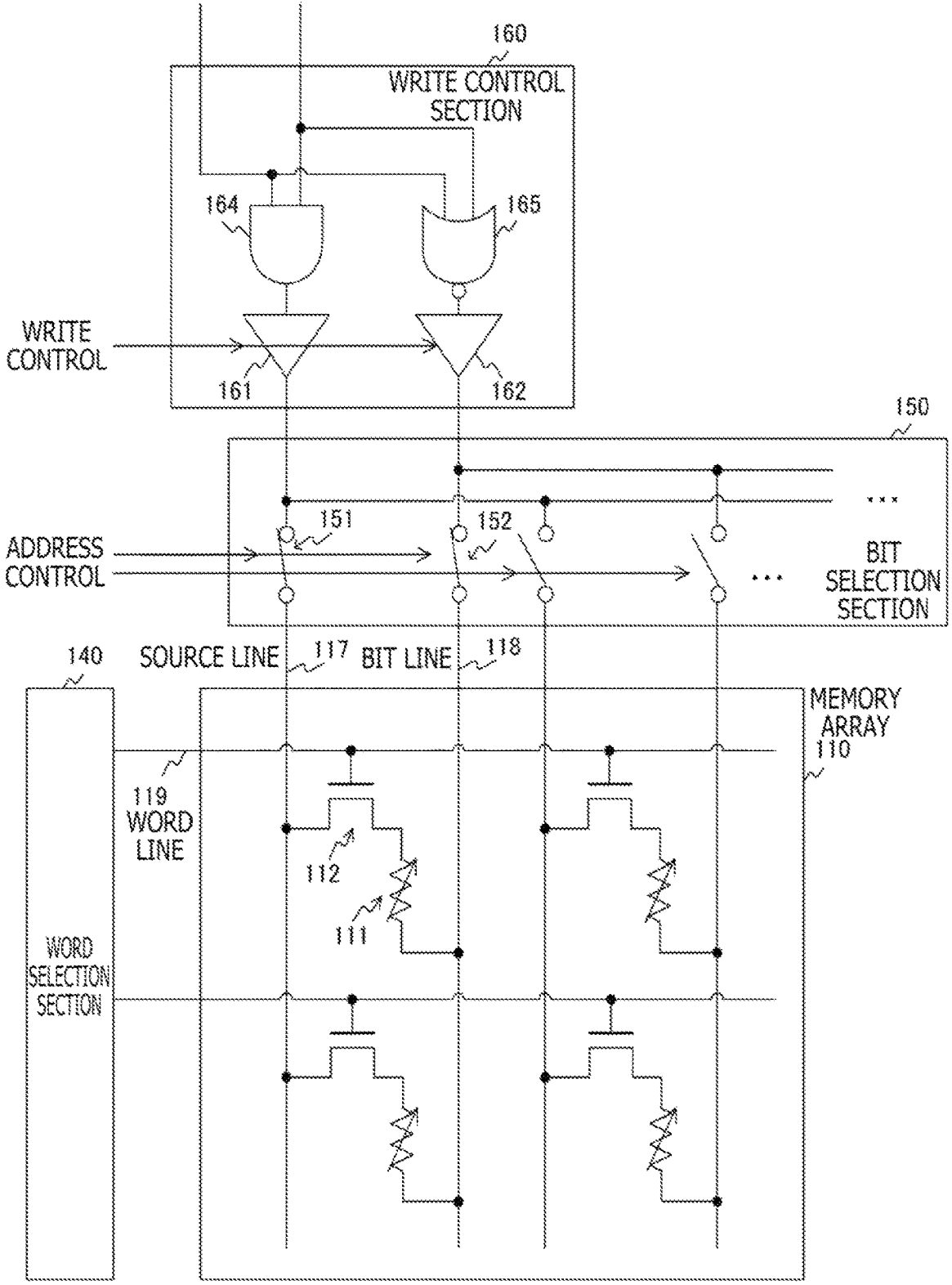
FIG. 4 is a diagram depicting a first exemplary circuit for write control in the first embodiment of the present technology.

FIG. 4 is a diagram depicting a first exemplary circuit for write control in the first embodiment of the present technology.

The memory cells in the memory array 110 each have a resistance change element 111 and a switch 112 serially connected between a source line 117 and a bit line 118. The resistance change element 111 may be a magnetic tunnel junction (MTJ) element, for example. The MTJ element is structured to have an insulation layer interposed between two magnetic bodies. The element manifests a different electrical resistance value depending on the magnetic state of the magnetic bodies.

A word line 119 is connected to the gate electrode of the switch 112. Driving the word line 119 causes the switch 112 to electrically conduct and thereby connects both ends of the resistance change element 111 to the source line 117 and bit line 118.

The bit selection section 150 has column switches 151 and 152 per column that are made to electrically conduct under control of the address control section 120. The column switches 151 and 152 are connected to the source line 117 and to the bit line 118, respectively. The bit selection section 150 controls the column switches 151 and 152 so as to change or read out the state of the resistance change element 111.

For example, at the time of writing, a current is allowed to flow from the side of the source line 117 to the side of the bit line 118, causing the resistance change element 111 to transition to a "1" state (high-resistance state). When a current is allowed to flow from the side of the bit line 118 to the side of the source line 117, the resistance change element 111 is caused to transition to a "0" state (low-resistance state).

The write control section 160 of this first example includes drivers 161 and 162, an AND circuit 164, and a NOR circuit 165.

The AND circuit 164 is a circuit that generates a logical product (AND) of the corresponding bit in the write-back data (information bits and check bits) and of the write-back direction. That is, if the corresponding bit is "1" when the write-back direction is "1," the AND circuit 164 outputs "1." Otherwise, the AND circuit 164 outputs "0."

The NOR circuit 165 is a circuit that generates a negative logical sum (NOR) of the corresponding bit in the write-back data (information bits and check bits) and of the write-back direction. That is, if the corresponding bit is "0" when the write-back direction is "0," the NOR circuit 165 outputs "1." Otherwise, the NOR circuit 165 outputs "0."

The drivers 161 and 162 apply voltages to the source line 117 and bit line 118 only in a case where the write control from the command control section 130 is "1." The driver 161 applies a voltage to the source line 117 in a case where the output from the AND circuit 164 indicates "1." The driver 162 applies a voltage to the bit line 118 in a case where the output from the NOR circuit 165 indicates "1."

Figure 5:
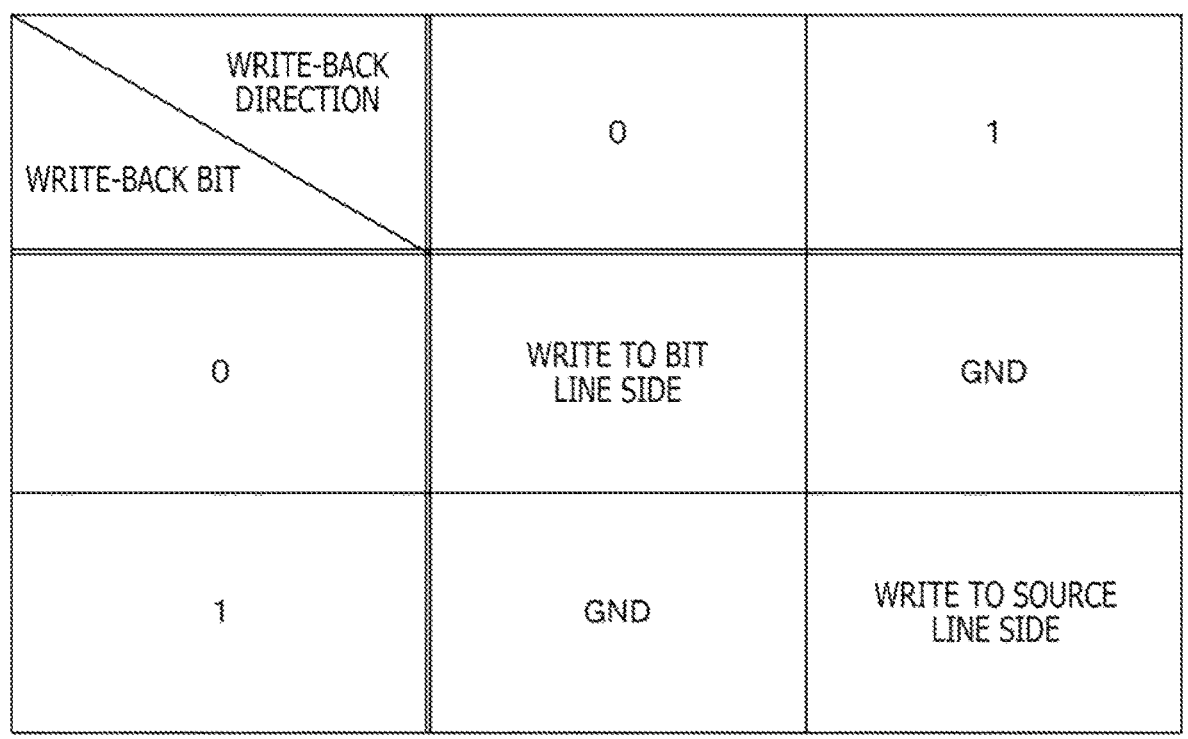
FIG. 5 is a diagram depicting a first exemplary truth table for write control in the first embodiment of the present technology.

FIG. 5 is a diagram depicting a first exemplary truth table for write control in the first embodiment of the present technology.

In a case where the write-back direction output from the correction circuit 240 is "0" and the corresponding bit in the write-back data (write-back bit) is "0," control is performed to let a current flow from the side of the bit line 118 to the side of the source line 117. On the other hand, if the write-back bit is "1," control is performed not to let a current flow by fixing the bit line 118 and the source line 117 to ground level (GND: ground).

In a case where the write-back direction output from the correction circuit 240 is "1" and the write-back bit is "1," control is performed to let a current flow from the side of the source line 117 to the side of the bit line 118. On the other hand, if the write-back bit is "0," control is performed not to let a current flow by fixing the bit line 118 and the source line 117 to ground level.

Figure 6:
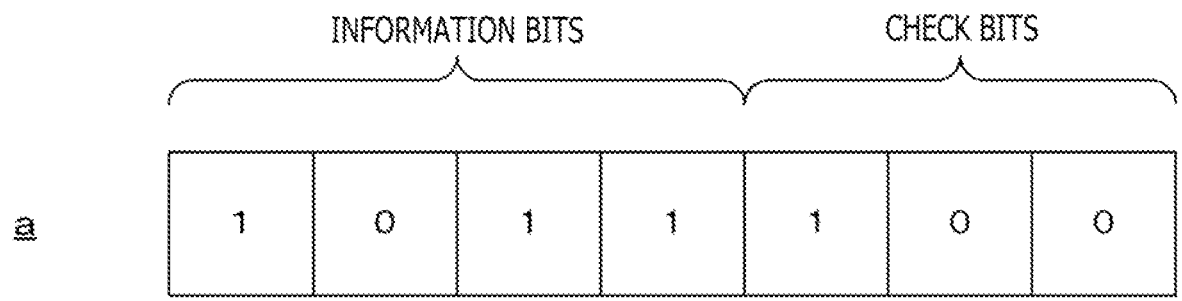
FIG. 6 depicts diagrams depicting specific examples of write control in the first embodiment of the present technology.
Figure 6:
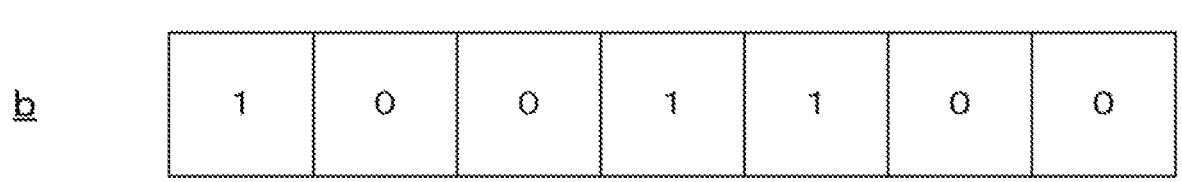
Figure 6:
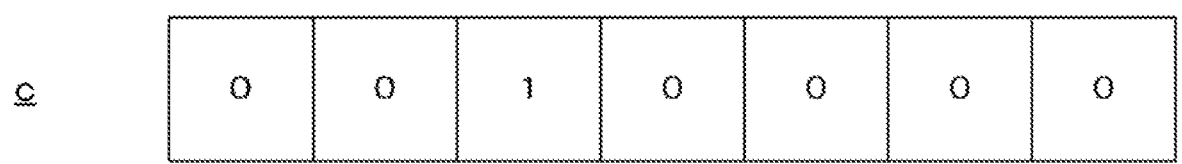

FIG. 6 depicts diagrams depicting specific examples of write control in the first embodiment of the present technology.

In this example, it is assumed that the write data includes seven bits "1011100" as depicted in "a" in FIG. 6. The first four bits are the information bits, and the last three bits are the check bits. It is assumed that the seven bits have been written to the memory array 110.

When the above-mentioned seven bits are subsequently read out of the memory array 110, they are assumed to constitute the readout data depicted in "b" in FIG. 6. Here, it is assumed that the third bit from the left is changed from the initial "1" to "0" by error. The error in the readout data is detected by the check circuit 230, so that the data corrected by the correction circuit 240 is output. To have the corrected data reflected in the memory array 110 requires writing the corrected data back thereto. However, since there is only one erroneous bit, writing the whole seven bits to the memory array 110 is deemed wasteful. In this embodiment, the write-back control section 220 thus generates the write-back data in which only the third bit from the left is set to "1" and the other bits are set to "0," as depicted in "c" in FIG. 6. The write-back data is written back when the write-back direction is set to "1."

[Operation]

Figure 7:
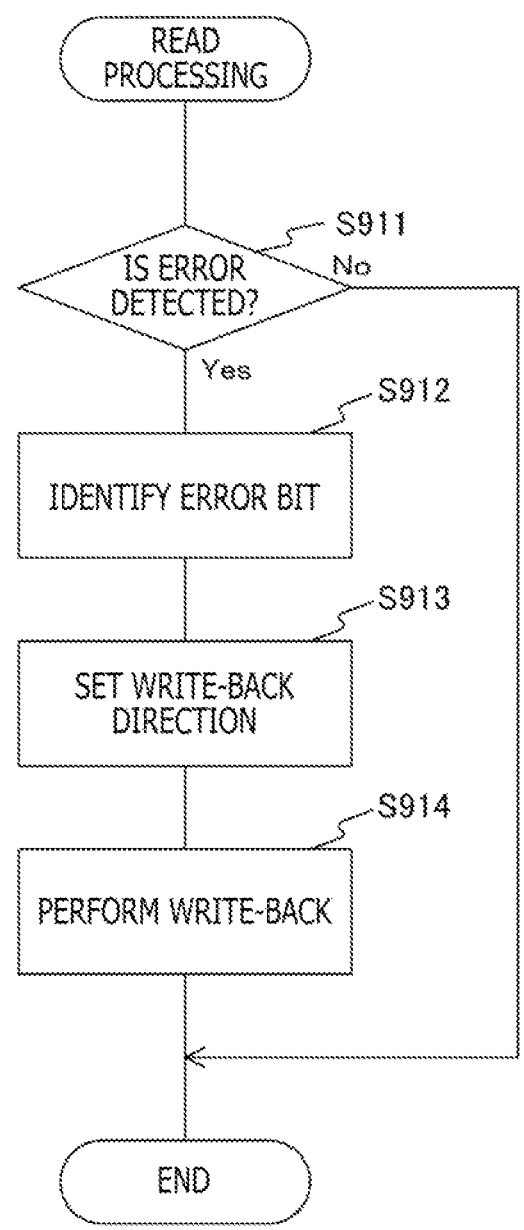
FIG. 7 is a flowchart depicting an exemplary processing procedure for read processing in the first embodiment of the present technology.

FIG. 7 is a flowchart depicting an exemplary processing procedure for read processing in the first embodiment of the present technology.

In a case where an error is detected in the data read out of the memory array 110 (step S911: Yes), the check circuit 230 identifies the bit in which the error has occurred (error bit) and outputs the correction bit number accordingly (step S912).

The correction circuit 240 sets the write-back direction on the basis of the data read out of the memory array 110 and the correction bit number identified by the check circuit 230 (step S913).

The write-back control section 220 then generates the write-back data. The write control section 160 performs the write-back in the set write-back direction (step S914).

Figure 8:
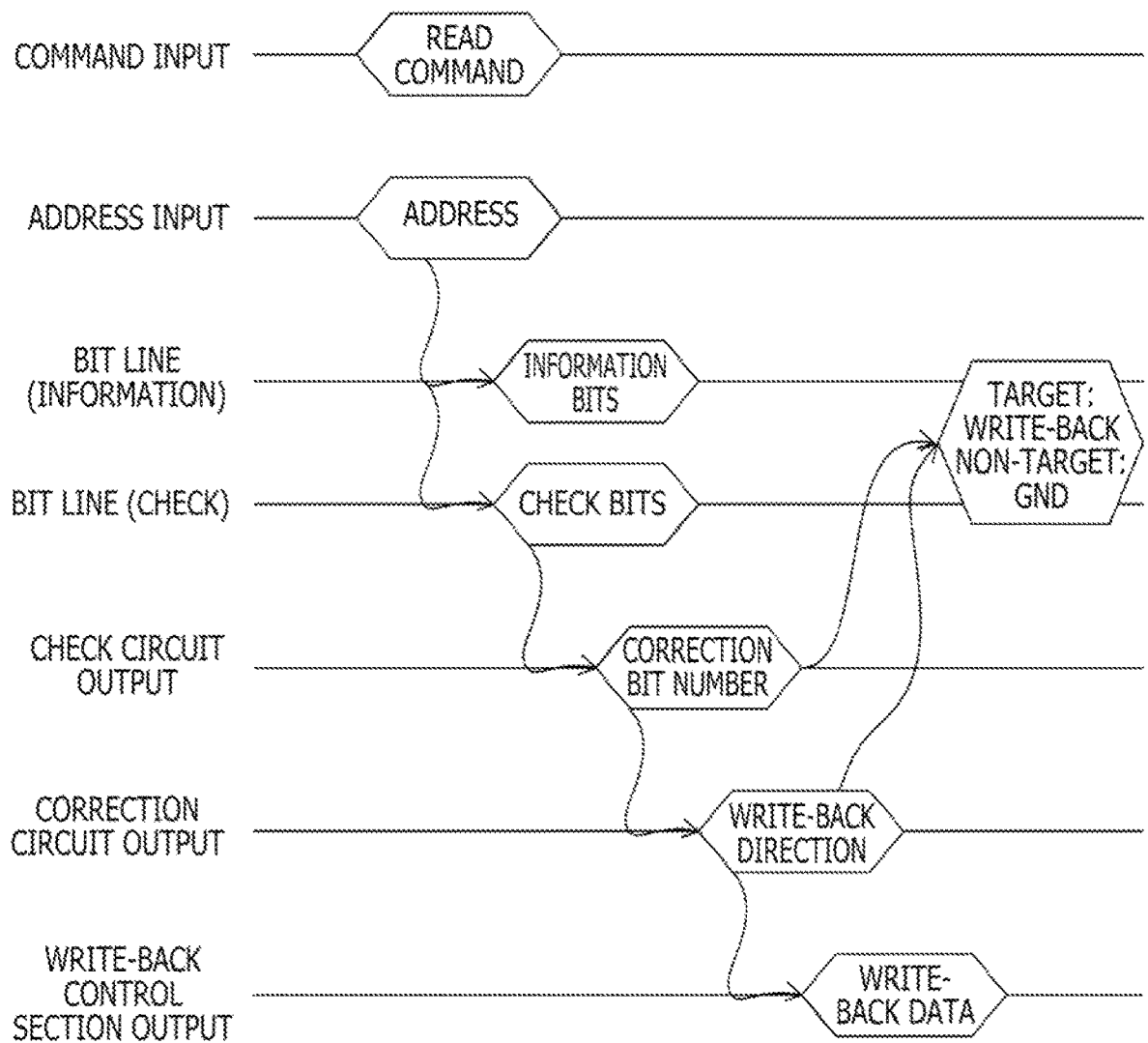
FIG. 8 is a diagram depicting an exemplary processing timing for read processing in the first embodiment of the present technology.

FIG. 8 is a diagram depicting an exemplary processing timing for read processing in the first embodiment of the present technology.

The host computer issues a read command as well as a read address. This causes the readout data including the information bits and check bits to be read out of the memory array 110.

The check circuit 230 identifies the error bit and outputs the correction bit number accordingly. The correction circuit 240 sets the write-back direction on the basis of the data read out of the memory array 110 and the correction bit number identified by the check circuit 230. The write-back control section 220 generates the write-back data.

This causes the write control section 160 to perform the write-back to the memory array 110. At this point, the bit of which the write-back direction matches that of the write-back data is written back, and the other bits are not written back with their bit lines 118 and source lines 117 fixed to ground level.

Figure 9:
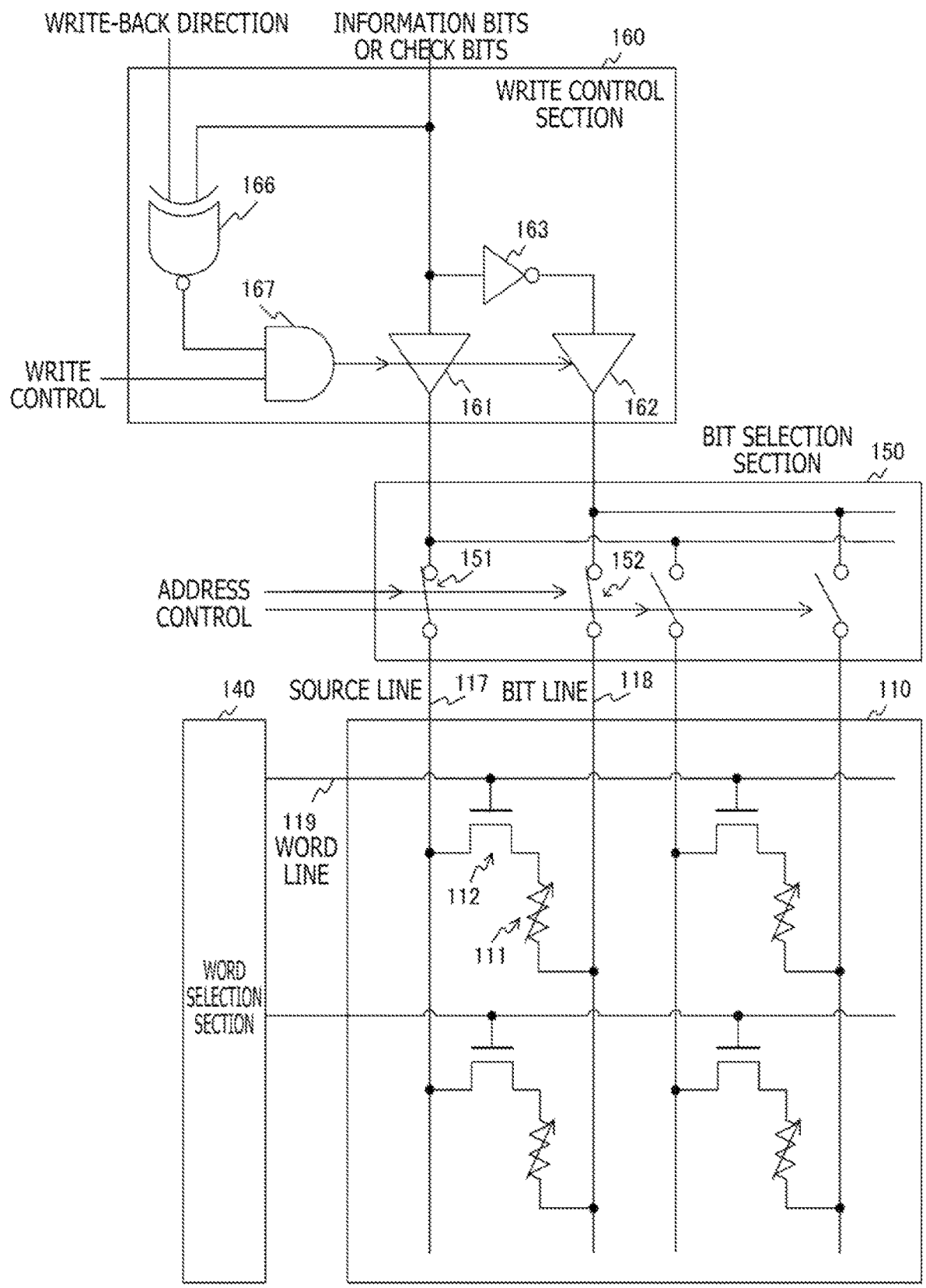
FIG. 9 is a diagram depicting a second exemplary circuit for write control in the first embodiment of the present technology.

FIG. 9 is a diagram depicting a second exemplary circuit for write control in the first embodiment of the present technology.

The write control section 160 of this second example includes drivers 161 and 162, a NOT circuit 163, an XNOR circuit 166, and an AND circuit 167.

The NOT circuit 163 is a circuit that inverts (NOT) the logic of the corresponding bit in the write-back data (information bits and check bits). The output from the NOT circuit 163 is input to the driver 162. On the other hand, the corresponding bit in the write-back data is input as is to the driver 161. That is, if the corresponding bit in the write-back data is "0," control is performed to let a current flow from the side of the bit line 118 to the side of the source line 117. If the corresponding bit in the write-back data is "1," control is performed to let a current flow from the side of the source line 117 to the side of the bit line 118.

The XNOR circuit 166 is a circuit that generates an exclusive-NOR (XNOR) of the corresponding bit in the write-back data and of the write-back direction. That is, when the corresponding bit in the write-back data matches the write-back direction, the XNOR circuit 166 outputs "1." Otherwise, the XNOR circuit 166 outputs "0."

The AND circuit 167 is a circuit that generates a logical product of the write control from the command control section 130 and of the output from the XNOR circuit 166. That is, in a case where a write command is issued and the corresponding bit in the write-back data matches the write-back direction, the AND circuit 167 outputs "1." Otherwise, the AND circuit 167 outputs "0." The drivers 161 and 162 apply voltages to the source line 117 and bit line 118 only when the AND circuit 167 outputs "1."

FIG. 10 is a diagram depicting a second exemplary truth table for write control in the first embodiment of the present technology.

In a case where the write-back direction output from the correction circuit 240 is "0" and the write-back bit is "0," control is performed to let a current flow from the side of the bit line 118 to the side of the source line 117. On the other hand, if the write-back bit is "1," control is performed not to let a current flow by fixing the bit line 118 and the source line 117 to high impedance (Hi-Z).

Further, in a case where the write-back direction output from the correction circuit 240 is "1" and the write-back bit is "1," control is performed to let a current flow from the side of the source line 117 to the side of the bit line 118. On the other hand, if the write-back bit is "0," control is performed not to let a current flow by fixing the bit line 118 and the source line 117 to high impedance.

Figure 11:
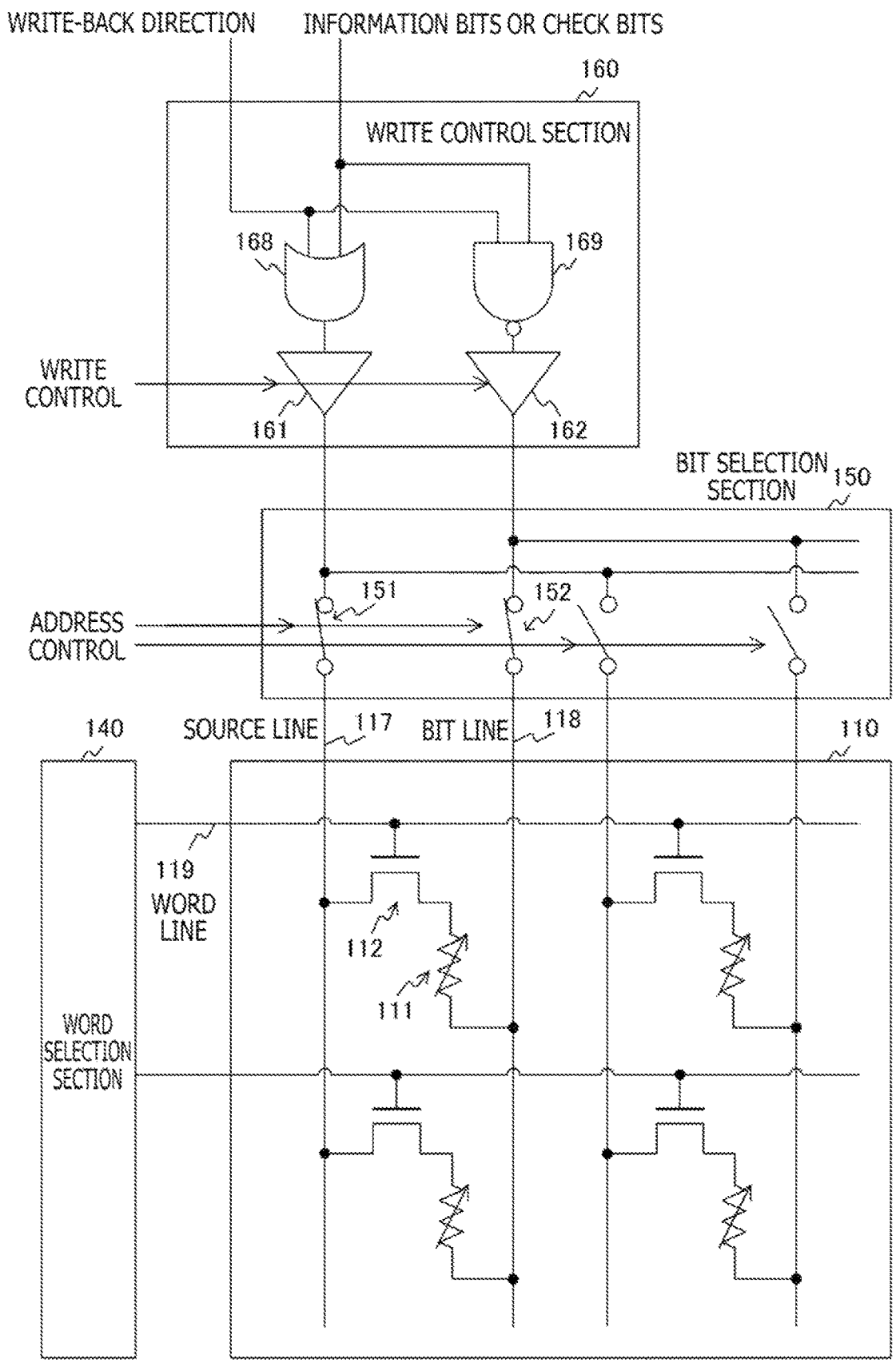
FIG. 11 is a diagram depicting a third exemplary circuit for write control in the first embodiment of the present technology.

FIG. 11 is a diagram depicting a third exemplary circuit for write control in the first embodiment of the present technology.

The write control section 160 of this third example includes drivers 161 and 162, an OR circuit 168, and a NAND circuit 169.

The OR circuit 168 is a circuit that generates a logical sum of the corresponding bit in the write-back data and of the write-back direction. That is, when the corresponding bit in the write-back data and the write-back direction are both "0," the OR circuit 168 outputs "0." Otherwise, the OR circuit 168 outputs "1."

The NAND circuit 169 is a circuit that generates a negative logical product (NAND) of the corresponding bit in the write-back data and of the write-back direction. That is, when the corresponding bit in the write-back data and the write-back direction are both "1," the NAND circuit 169 outputs "0." Otherwise, the NAND circuit 169 outputs "1."

The drivers 161 and 162 apply voltages to the source line 117 and bit line 118 only in the case where the write control from the command control section 130 is "1."

Figure 12:
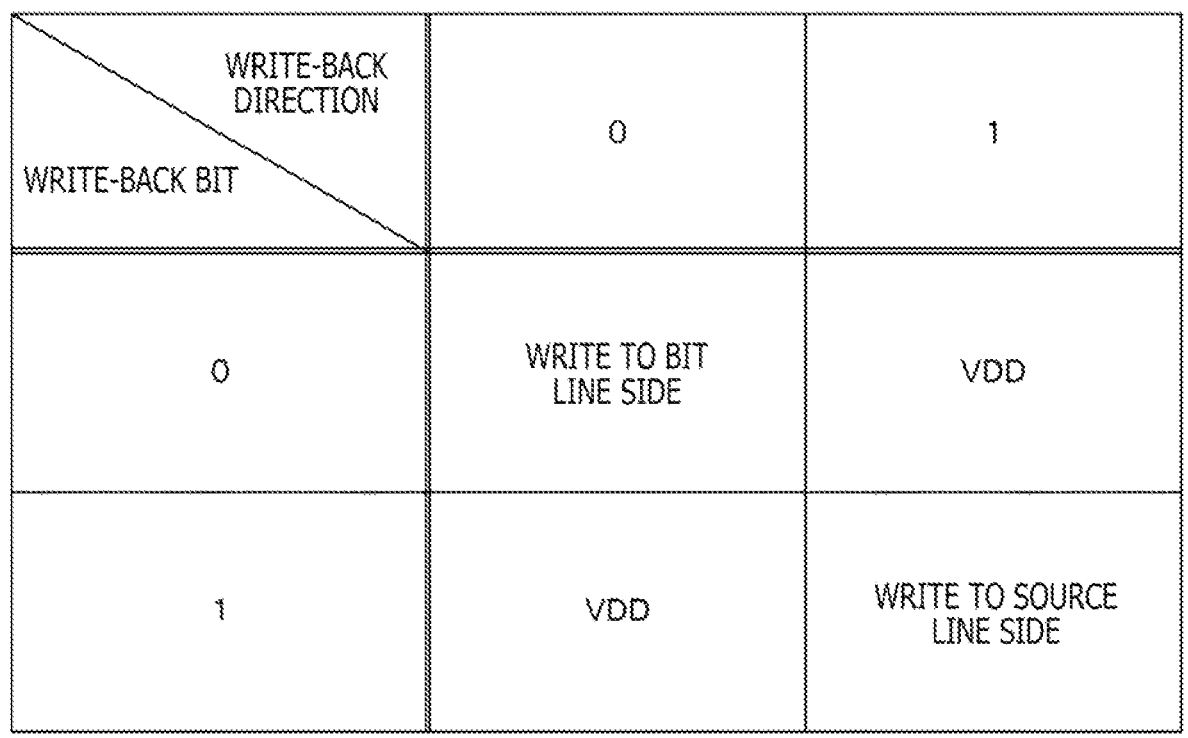
FIG. 12 is a diagram depicting a third exemplary truth table for write control in the first embodiment of the present technology.

FIG. 12 is a diagram depicting a third exemplary truth table for write control in the first embodiment of the present technology.

In a case where the write-back direction output from the correction circuit 240 is "0" and the write-back bit is "0," control is performed to let a current flow from the side of the bit line 118 to the side of the source line 117. On the other hand, if the write-back bit is "1," control is performed not to let a current flow by fixing the bit line 118 and the source line 117 to the power level (VDD).

Further, in a case where the write-back direction output from the correction circuit 240 is "1" and the write-back bit is "1," control is performed to let a current flow from the side of the source line 117 to the side of the bit line 118. On the other hand, if the write-back bit is "0," control is performed not to let a current flow by fixing the bit line 118 and the source line 117 to the power level.

Figure 13:
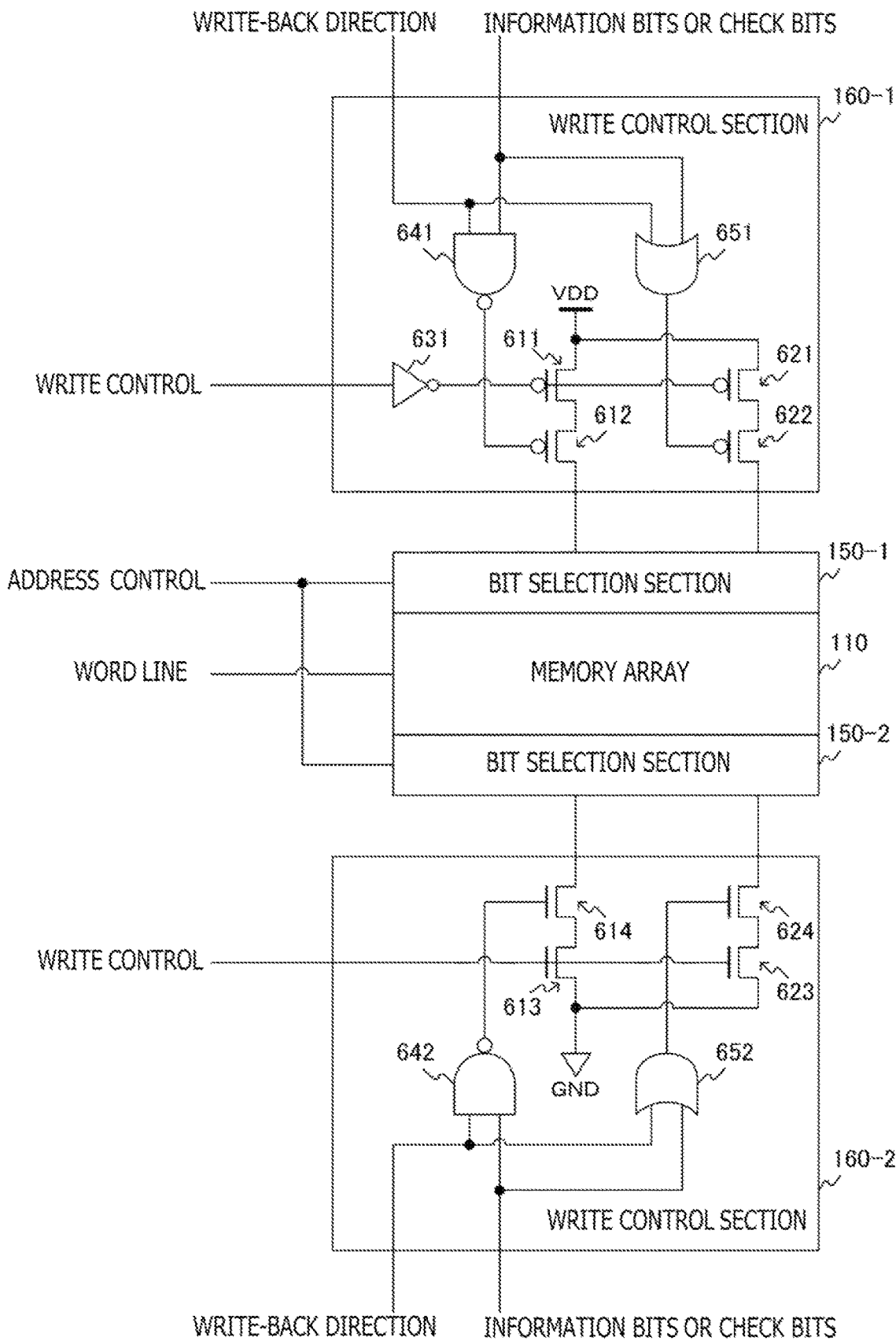
FIG. 13 is a diagram depicting a fourth exemplary circuit for write control in the first embodiment of the present technology.

FIG. 13 is a diagram depicting a fourth exemplary circuit for write control in the first embodiment of the present technology.

In this fourth example, the write control section 160 is divided into two write control sections 160-1 and 160-2 arranged symmetrically to each other across the memory array 110 interposed therebetween. As a result, the bit selection section 150 is likewise divided into bit selection sections 150-1 and 150-2. The write control section 160-1 plays the role of applying the power level, and the write control section 160-2 plays the role of applying the ground level. This arrangement aligns write distances to each of the memory cells in the memory array 110, thereby eliminating the cause of an error stemming from the wire resistance component.

The basic structure of the write control sections 160-1 and 160-2 is similar to that in the third example described above. That is, when the corresponding bit in the write-back data and the write-back direction are both "1," drivers 612 and 624 are turned on, thereby performing control to let a current flow from the side of the source line 117 to the side of the bit line 118. When the corresponding bit in the write-back data and the write-back direction are both "0," drivers 614 and 622 are turned on, thereby performing control to let a current flow from the side of the bit line 118 to the side of the source line 117. Otherwise, control is performed not to let a current flow by fixing the bit line 118 and the source line 117 to the power level or to ground level.

According to the first embodiment of the present technology, as described above, the bits targeted for write-back to the memory array 110 are minimized. This reduces the power needed for the write-back to the memory array 110.

2. Second Embodiment

Whereas the information bits and the check bits are stored in the single memory array 110 in the above-described first embodiment, these two kinds of bits may alternatively be stored separately. In a second embodiment, the information bits and the check bits are assumed to be stored in different memory arrays.

[Storage Apparatus]

Figure 14:
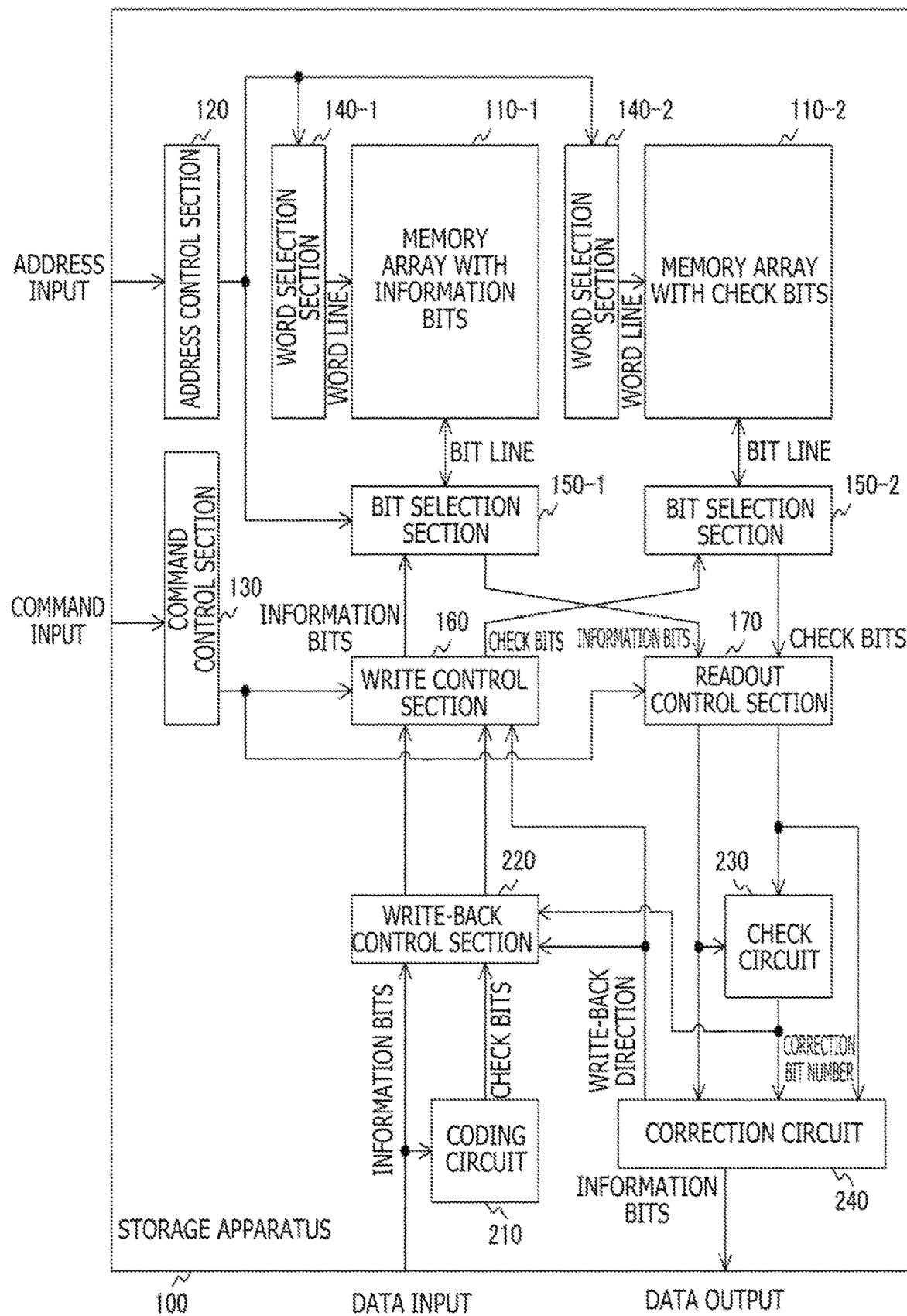
FIG. 14 is a diagram depicting an exemplary overall configuration of the storage apparatus 100 in a second embodiment of the present technology.

FIG. 14 is a diagram depicting an exemplary overall configuration of the storage apparatus 100 in the second embodiment of the present technology.

In the second embodiment, one set of the memory array 110, the word selection section 140, and the bit selection section 150 is provided for each of the information bits and the check bits. That is, a memory array 110-1 is provided to store the information bits, with a word selection section 140-1 and a bit selection section 150-1 provided to drive the memory array 110-1. A memory array 110-2 is further provided to store the check bits, with a word selection section 140-2 and a bit selection section 150-2 provided to drive the memory array 110-2. These components may be located on the same semiconductor chip or on different semiconductor chips.

The other structures are similar to those in the first embodiment and thus will not be described further in detail.

According to the second embodiment of the present technology, as described above, the memory array 110-1 for storing the information bits and the memory array 110-2 for storing the check bits are divided from each other when provided. This makes it possible to adopt a flexible floor plan.

3. Third Embodiment

Whereas the above-described first embodiment has circuits such as the coding circuit 210 and the correction circuit 240 incorporated in the storage apparatus 100, these circuits may be located outside the storage apparatus 100. A third embodiment is explained below as an example in which some of the circuits related to the check bits and the write-back are provided outside the storage apparatus 100.

[Storage Apparatus and Storage Control Apparatus]

Figure 15:
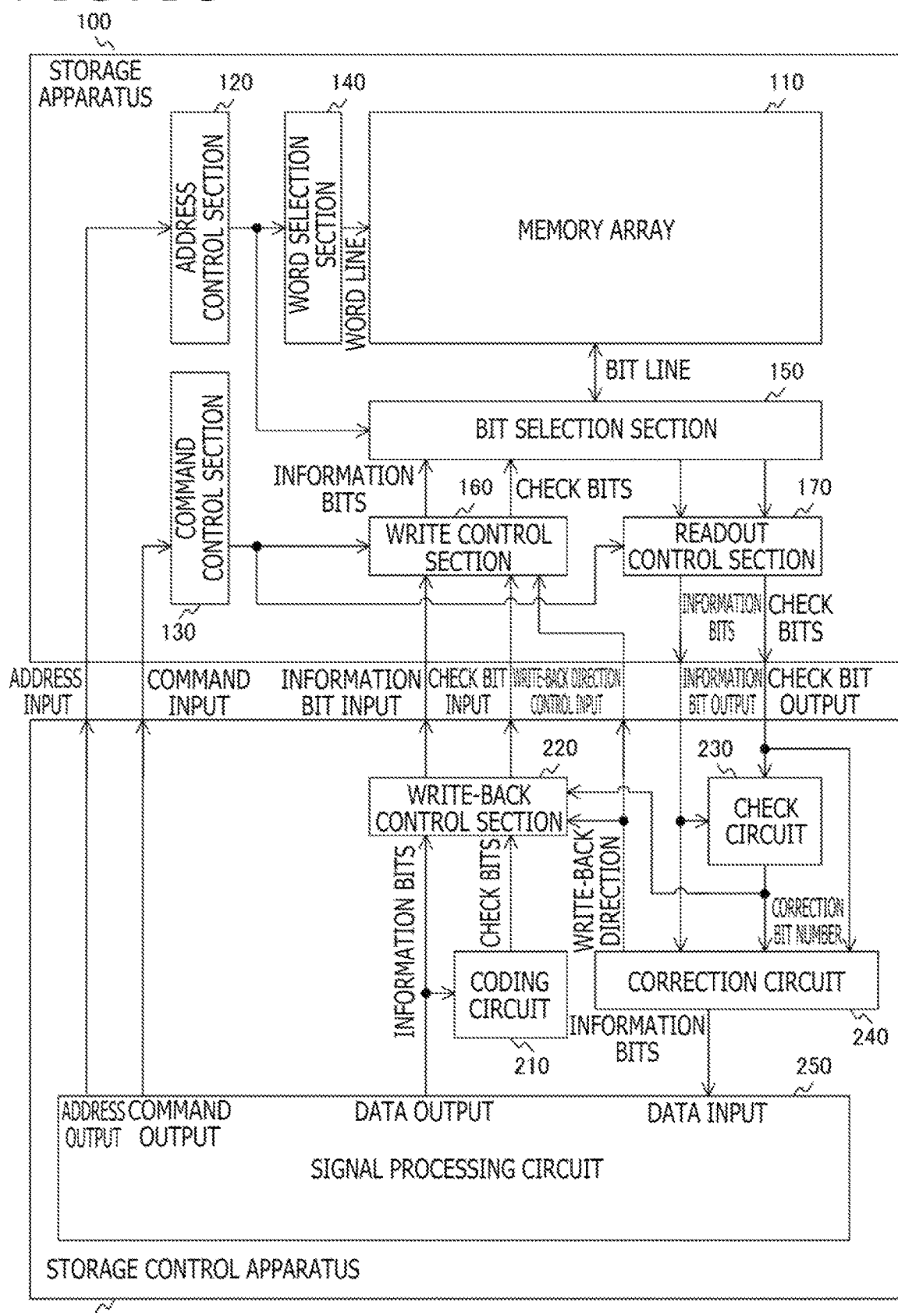
FIG. 15 is a diagram depicting an exemplary overall configuration of the storage apparatus 100 and a storage control apparatus 200 in a third embodiment of the present technology.

FIG. 15 is a diagram depicting an exemplary overall configuration of the storage apparatus 100 and the storage control apparatus 200 in the third embodiment of the present technology.

In the third embodiment, the coding circuit 210, the write-back control section 220, the check circuit 230, the correction circuit 240, and a signal processing circuit 250 are provided in the storage control apparatus 200. The signal processing circuit 250 controls the issuing of commands to the storage apparatus 100 and also controls the writing and reading of data thereto and therefrom. The signal processing circuit 250 may be located outside the storage control apparatus 200.

The storage apparatus 100 and the storage control apparatus 200 may be located in different blocks on the same semiconductor chip or on different semiconductor chips.

According to the third embodiment of the present technology, as described above, some of the circuits related to the check bits and the write-back are provided outside the storage apparatus 100. This also makes it possible to adopt a flexible floor plan.

4. Fourth Embodiment

Whereas the above-described first embodiment performs write-back control as part of the read operation, write-back control may be carried out independently. In a fourth embodiment, write-back control is assumed to be performed at a timing independent of that of the read operation.

[Storage Apparatus]

Figure 16:
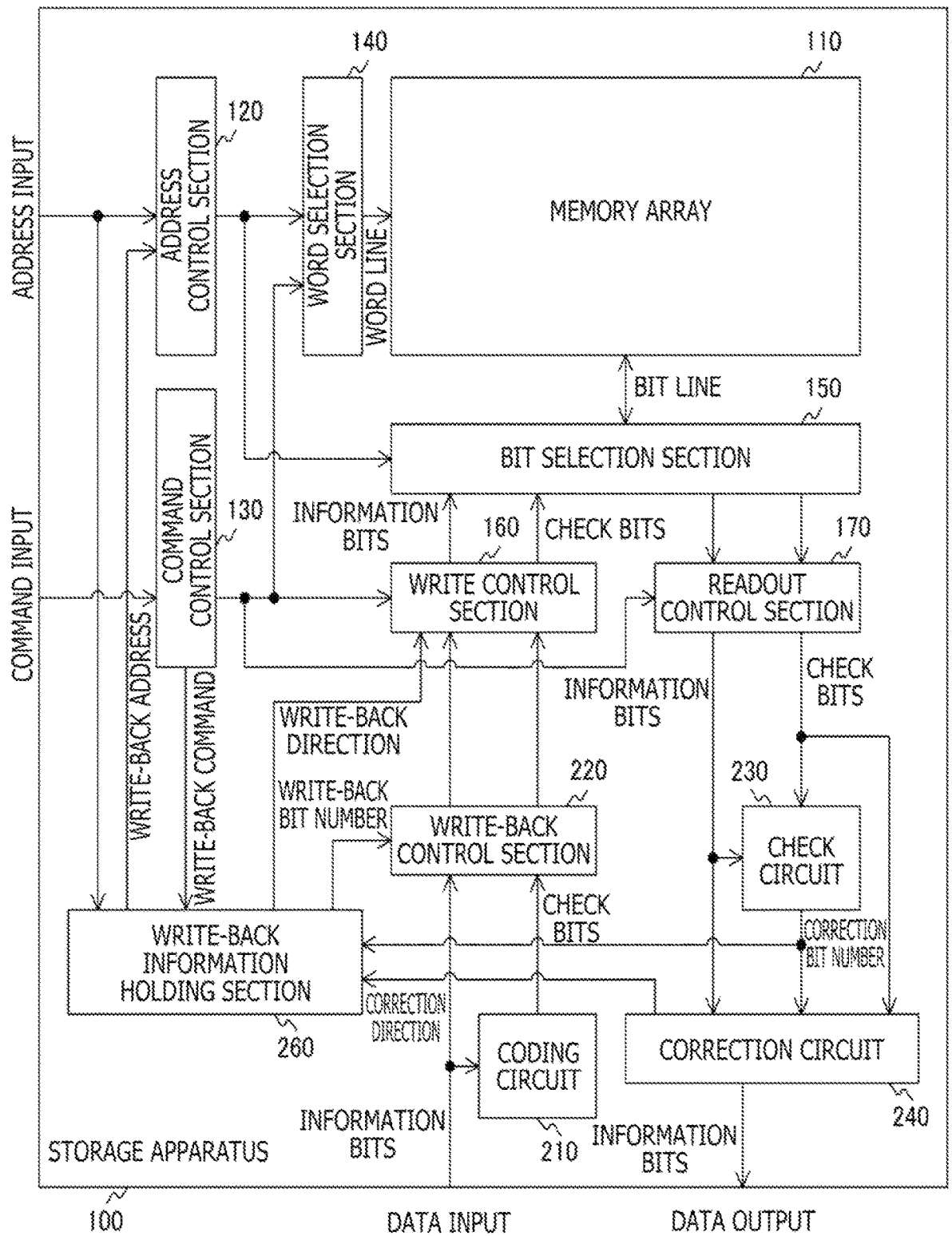
FIG. 16 is a diagram depicting an exemplary overall configuration of the storage apparatus 100 in a fourth embodiment of the present technology.

FIG. 16 is a diagram depicting an exemplary overall configuration of the storage apparatus 100 in the fourth embodiment of the present technology.

The storage apparatus 100 in the fourth embodiment includes a write-back information holding section 260 in addition to the configuration of the above-described first embodiment. The write-back information holding section 260 holds the correction address of the write-back target as well as the write-back direction and the correction bit address associated therewith. In response to the write-back command designated by an externally input command, the write-back information holding section 260 outputs the information held therein to the address control section 120, the write-back control section 220, and the write control section 160 so as to write the corrected data back to the memory array 110. This makes it possible to perform write-back control at a timing independent of that of the read operation.

Figure 17:
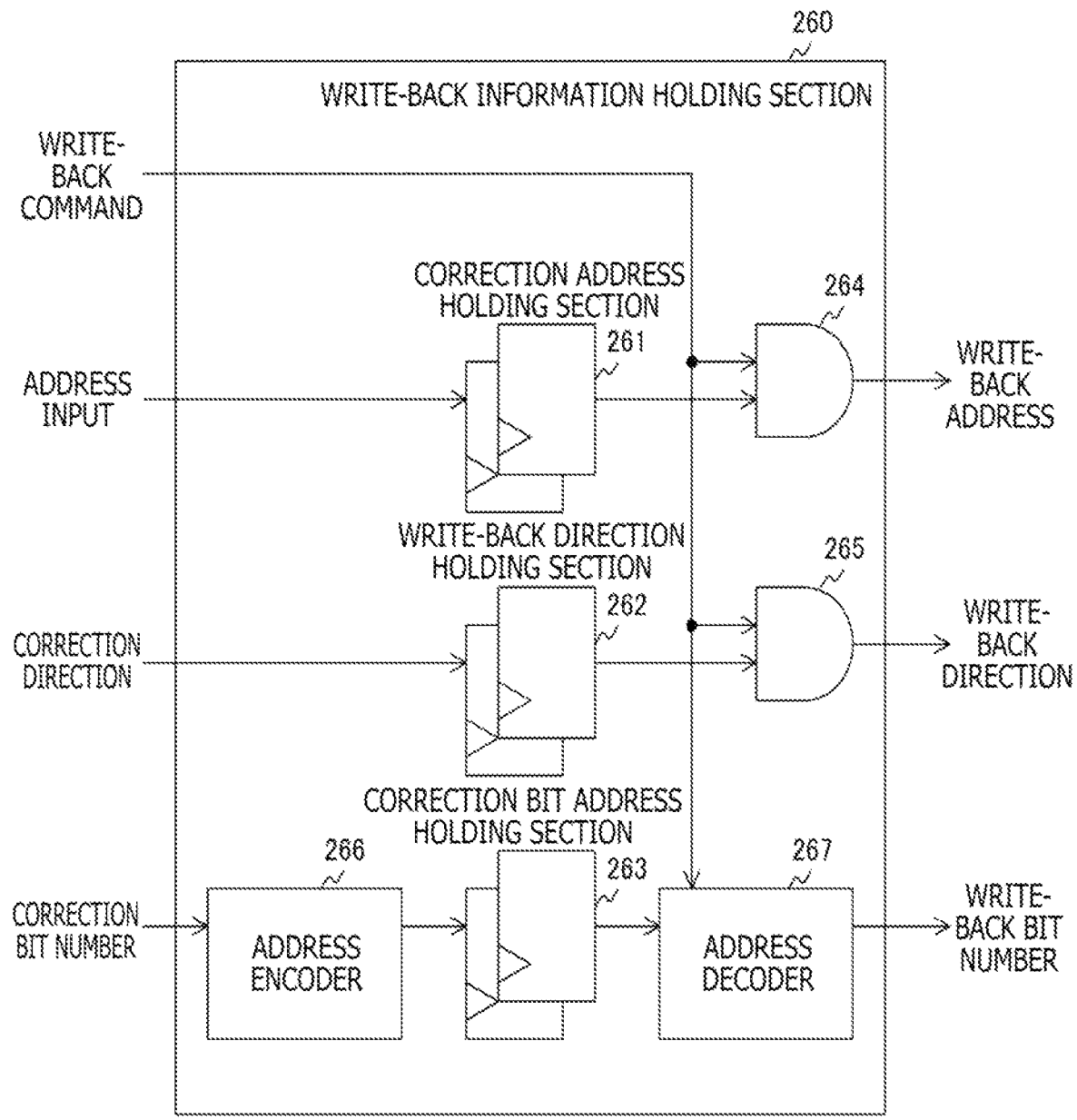
FIG. 17 is a diagram depicting an exemplary configuration of a write-back information holding section 260 in the fourth embodiment of the present technology.

FIG. 17 is a diagram depicting an exemplary configuration of the write-back information holding section 260 in the fourth embodiment of the present technology.

The write-back information holding section 260 includes a correction address holding section 261, a write-back direction holding section 262, a correction bit address holding section 263, AND circuits 264 and 265, an address encoder 266, and an address decoder 267.

The correction address holding section 261 holds the correction address of the write-back target. The write-back direction holding section 262 holds the write-back direction of the write-back target. The correction bit address holding section 263 holds the correction bit address of the write-back target.

The AND circuit 264 is a circuit that generates a logical product of the correction address held in the correction address holding section 261 and a control signal of the write-back command. This allows the write-back address to be output when the write-back command is issued.

The AND circuit 265 is a circuit that generates a logical product of the write-back direction held in the write-back direction holding section 262 and the control signal of the write-back command. This allows the write-back direction to be output when the write-back command is issued.

The address encoder 266 is an encoder that encodes the correction bit number from the check circuit 230 into the correction bit address. The output from the address encoder 266 is held in the correction bit address holding section 263. The encoding can shorten the bit width to be held in the correction bit address holding section 263.

The address decoder 267 is a decoder that decodes the correction bit address held in the correction bit address holding section 263. When the write-back command is issued, the address decoder 267 outputs the write-back bit number.

[Operation]

Figure 18:
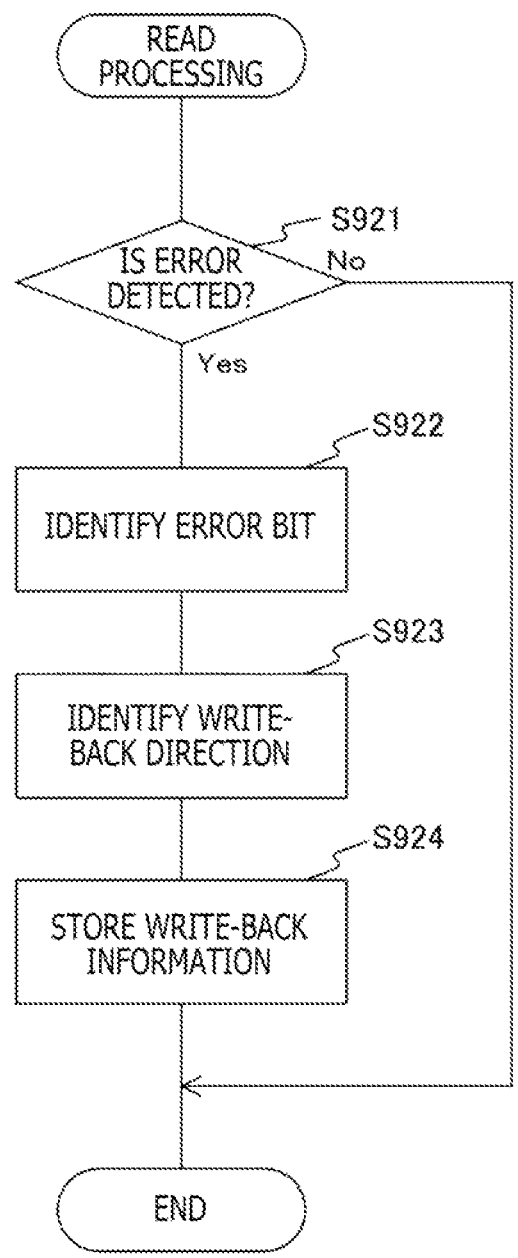
FIG. 18 is a flowchart depicting an exemplary processing procedure for read processing in the fourth embodiment of the present technology.

FIG. 18 is a flowchart depicting an exemplary processing procedure for read processing in the fourth embodiment of the present technology.

In a case where data is read from the memory array 110 and an error is detected in the data (step S921: Yes), the check circuit 230 identifies the error bit and outputs the correction bit number accordingly (step S922).

The correction circuit 240 sets the write-back direction on the basis of the data read from the memory array 110 and the correction bit number identified by the check circuit 230 (step S923).

The write-back information holding section 260 then holds the correction address of the write-back target as well as the write-back direction and the correction bit address associated therewith as the write-back information (step S924).

Figure 19:
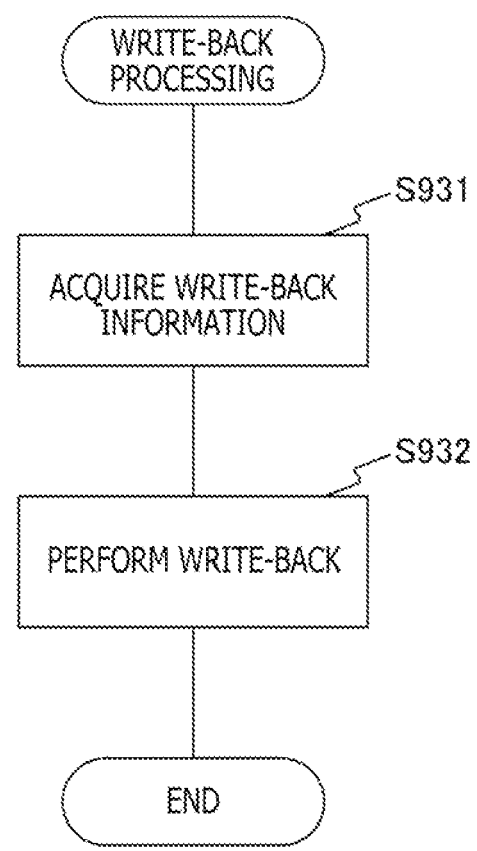
FIG. 19 is a flowchart depicting an exemplary processing procedure for write-back processing in the fourth embodiment of the present technology.

FIG. 19 is a flowchart depicting an exemplary processing procedure for write-back processing in the fourth embodiment of the present technology.

When the write-back command is issued, the write-back information is read from the write-back information holding section 260. The write-back bit number is then fed to the write-back control section 220, the write-back direction is sent to the write control section 160, and the write-back address is supplied to the address control section 120 (step S931). A write-back operation is then performed on the memory array 110 (step S932).

According to the fourth embodiment of the present technology, as described above, providing the write-back information holding section 260 makes it possible to perform write-back control at a timing independent of that of the read operation.

5. Fifth Embodiment

Whereas the above-described fourth embodiment has circuits such as the coding circuit 210 and the correction circuit 240 incorporated in the storage apparatus 100 as in the case of the first embodiment, these circuits may be located outside the storage apparatus 100 as in the third embodiment. A fifth embodiment is explained below as an example in which some of the circuits associated with the check bits and the write back in the fourth embodiment are provided outside the storage apparatus 100.

[Storage Apparatus and Storage Control Apparatus]

Figure 20:
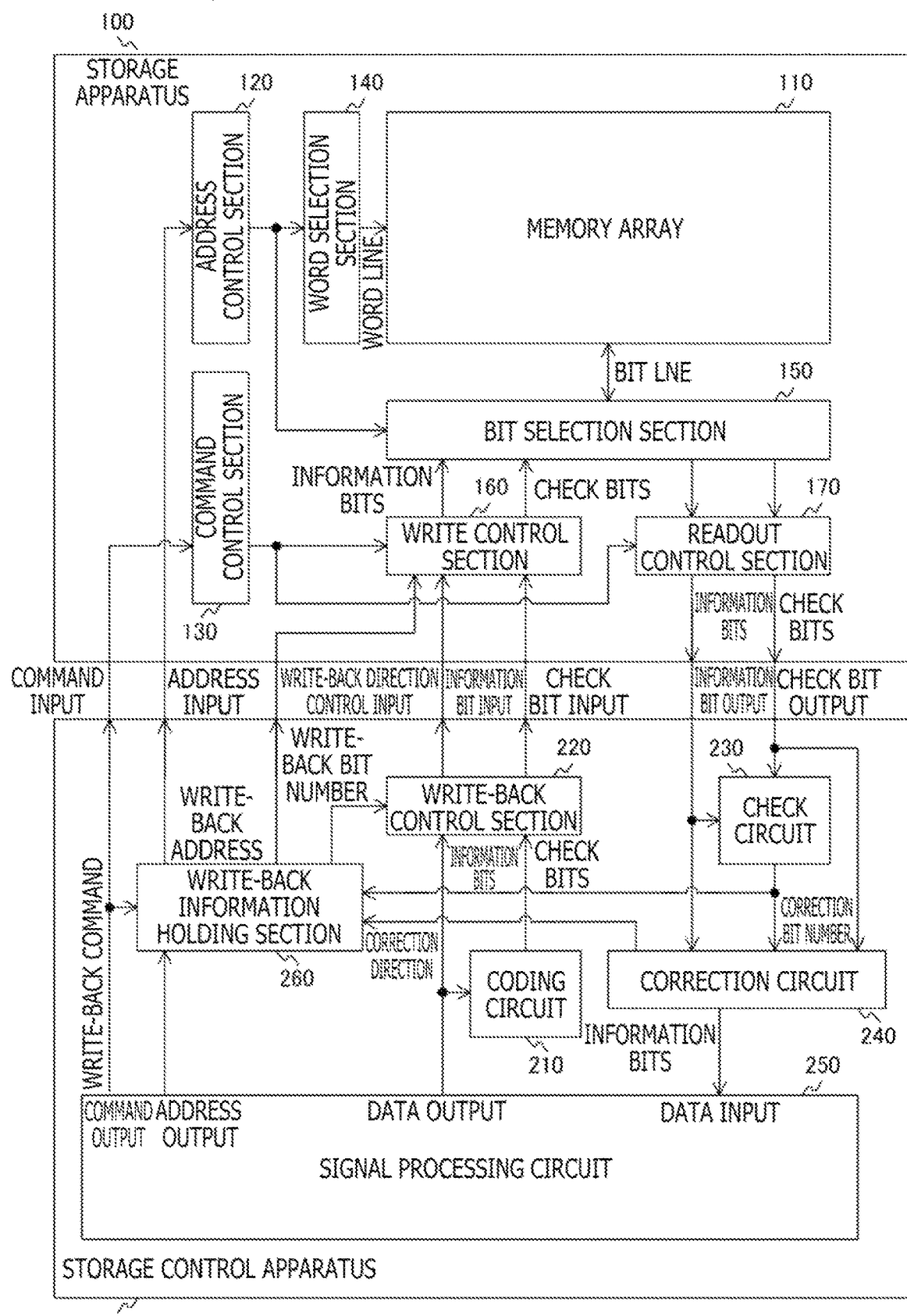
FIG. 20 is a diagram depicting an exemplary overall configuration of the storage apparatus 100 and the storage control apparatus 200 in a fifth embodiment of the present technology.

FIG. 20 is a diagram depicting an exemplary overall configuration of the storage apparatus 100 and the storage control apparatus 200 in the fifth embodiment of the present technology.

In the fifth embodiment, the coding circuit 210, the write-back control section 220, the check circuit 230, the correction circuit 240, and the signal processing circuit 250 of the third embodiment are supplemented with the write-back information holding section 260 included in the storage control apparatus 200.

Figure 21:
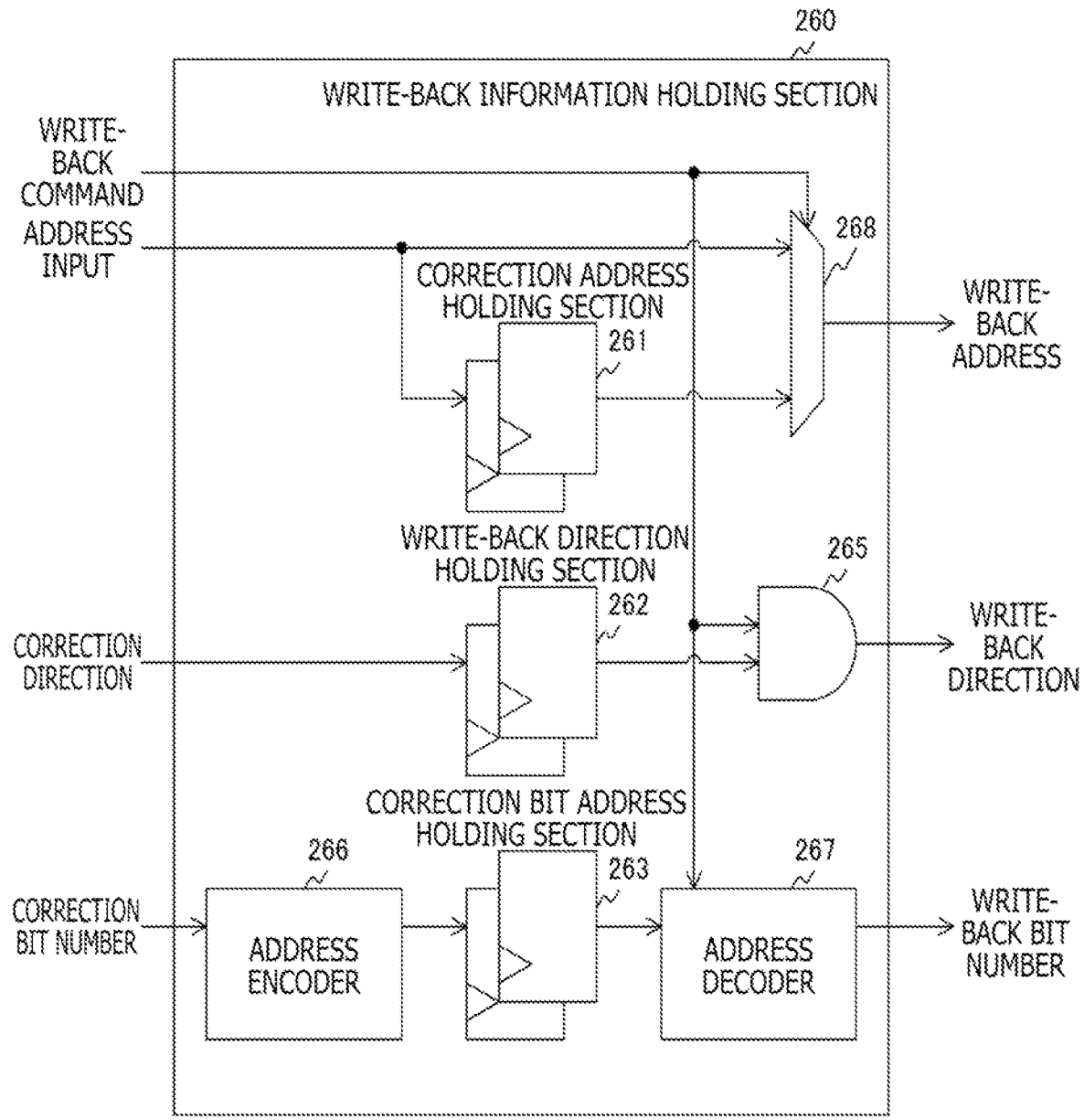
FIG. 21 is a diagram depicting an exemplary configuration of the write-back information holding section 260 in the fifth embodiment of the present technology.

FIG. 21 is a diagram depicting an exemplary configuration of the write-back information holding section 260 in the fifth embodiment of the present technology.

In the fifth embodiment, the write-back information holding section 260 has a selector 268 in place of the AND circuit 264 of the above-described fourth embodiment. In a case where the write-command is issued, the selector 268 selects the correction address held in the correction address holding section 261. Otherwise, the selector 268 selects the input address. This allows the correction address to be output as the write-back address when the write-back is performed. Otherwise, the input address is allowed to pass through and supplied to the address control section 120.

According to the fifth embodiment of the present technology, as described above, the write-back information holding section 260 is provided in the storage control apparatus 200. This enables the write-back control to be performed at a timing independent of that of the read operation.

6. Sixth Embodiment

In the above-described embodiments, a one-bit error is assumed to occur. It is also possible to correct a multiple-bit error by use of similar configurations. In a case where a multiple-bit error has occurred and there exist the correction directions of both "0" and "1," a sixth embodiment is provided to perform the write-back sequentially in the "0" direction and in the "1" direction.

[Operation]

Figure 22:
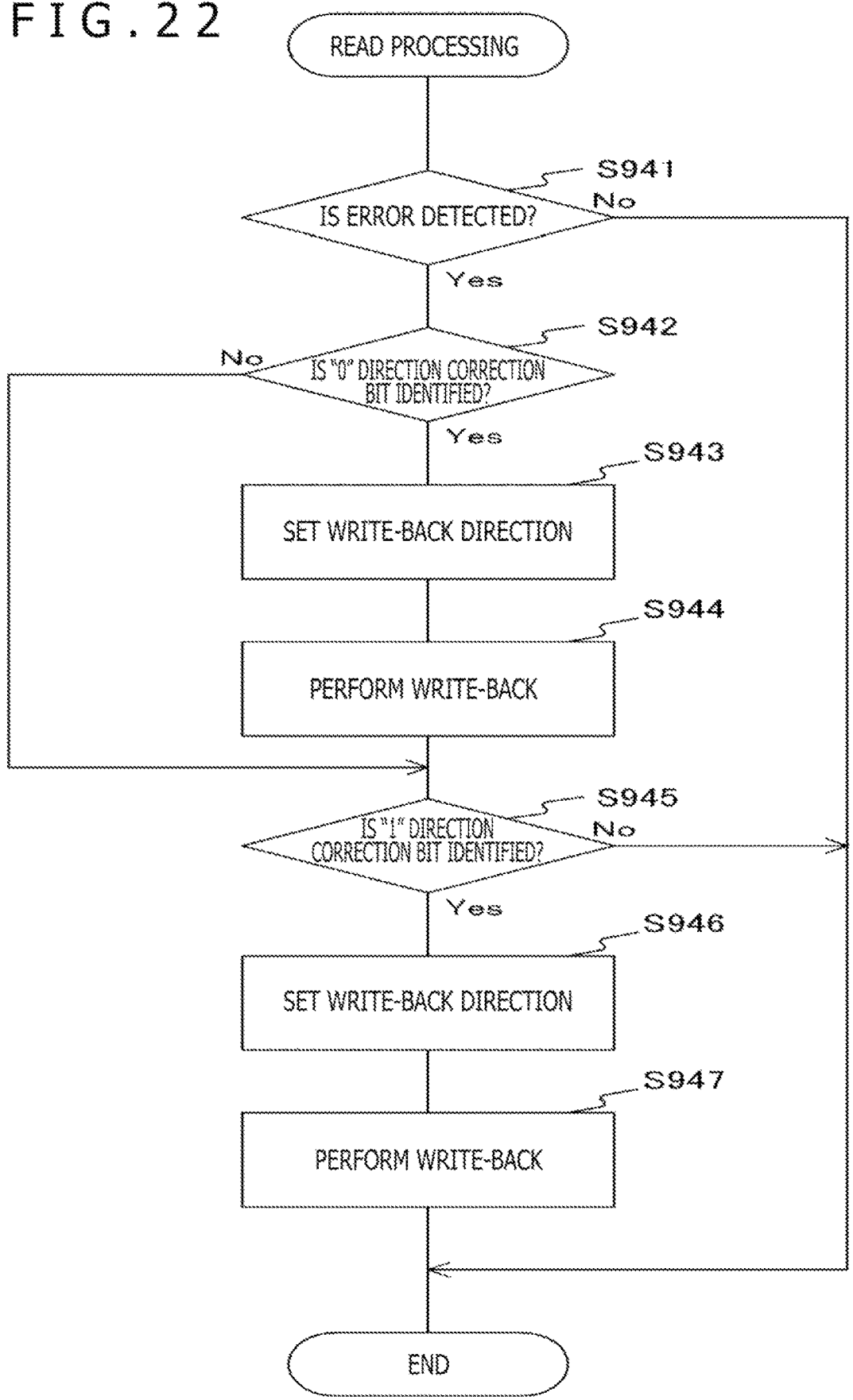
FIG. 22 is a flowchart depicting an exemplary processing procedure for read processing in a sixth embodiment of the present technology.

FIG. 22 is a flowchart depicting an exemplary processing procedure for read processing in the sixth embodiment of the present technology.

In a case where data is read from the memory array 110, an error is detected in the data (step S941: Yes), and the check circuit 230 identifies the error in the direction of "0" (step S942: Yes), the check circuit 230 outputs the correction bit number accordingly. The correction circuit 240 sets the write-back direction on the basis of the data read from the memory array 110 and the correction bit number identified by the check circuit 230 (step S943). The write-back control section 220 then generates write-back data, and the write control section 160 performs the write-back in the set write-back direction (step S944).

If the check circuit 230 identifies an error bit in the direction of "1" (step S945: Yes), the check circuit 230 outputs the correction bit number accordingly. The correction circuit 240 sets the write-back direction on the basis of the data read from the memory array 110 and the correction bit number identified by the check circuit 230 (step S946). The write-back control section 220 then generates write-back data, and the write control section 160 performs the write-back in the set write-back direction (step S947).

In the above example, the write-back in the "0" direction and the write-back in the "1" direction are performed sequentially in that order. Alternatively, the write-back sequence may be changed as needed.

According to the sixth embodiment of the present technology, as described above, even in a case where a multiple-bit error occurs, the bits targeted for write-back to the memory array 110 are minimized. This can also reduce the power needed for the write-back to the memory array 110.

7. Application Examples

Figure 23:
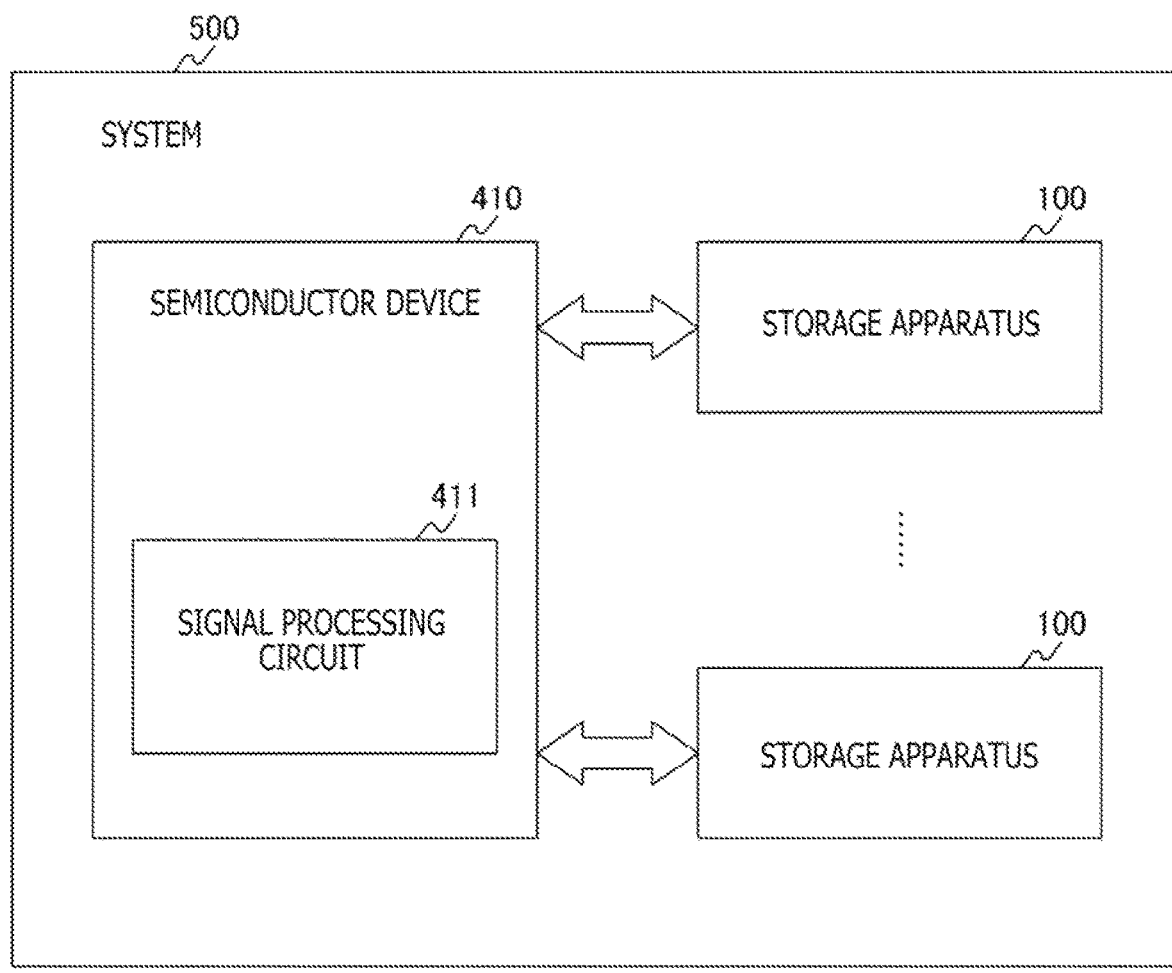
FIG. 23 is a diagram depicting a first configuration example of a system 500 as an application example of the storage apparatus 100 embodying the present technology.
Figure 24:
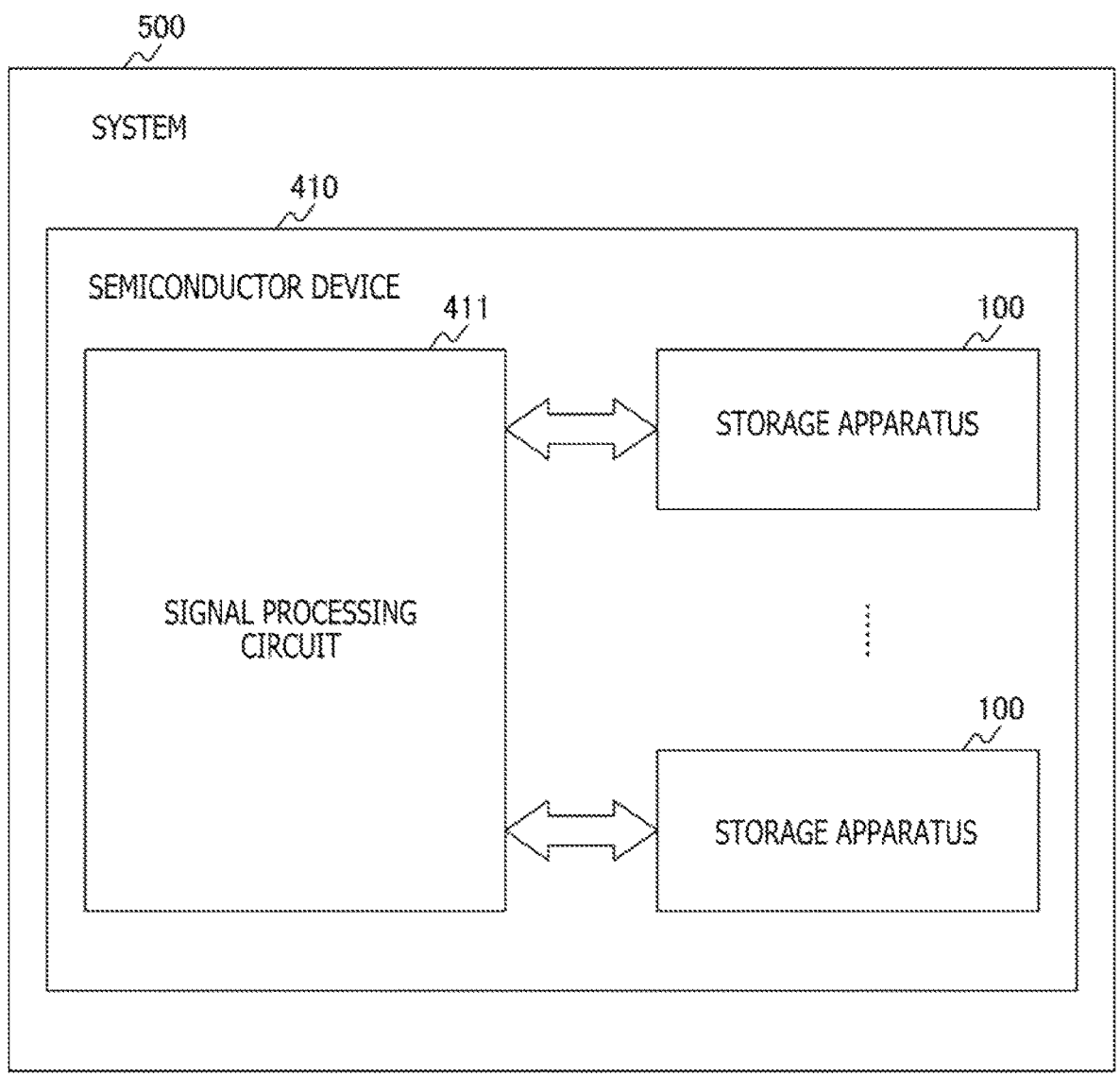
FIG. 24 is a diagram depicting a second configuration example of the system 500 as another application example of the storage apparatus 100 embodying the present technology.

FIGS. 23 and 24 are diagrams depicting application examples of the storage apparatus 100 embodying the present technology.

One or more units of the storage apparatus 100 embodying the present technology may be incorporated in the same semiconductor device that has the control circuit for controlling the storage apparatus 100, or in a semiconductor device different from the one having the control circuit for controlling the storage apparatus 100.

The example in FIG. 23 is that of a system 500 in which the storage apparatus 100 is connected with a semiconductor device 410 having a signal processing circuit 411. The signal processing circuit 411 is a circuit that generates signals for writing and reading data to and from the storage apparatus 100.

The example in FIG. 24 is that of the system 500 in which the storage apparatus 100 is incorporated in the semiconductor device 410 that has the signal processing circuit 411.

Figure 25:
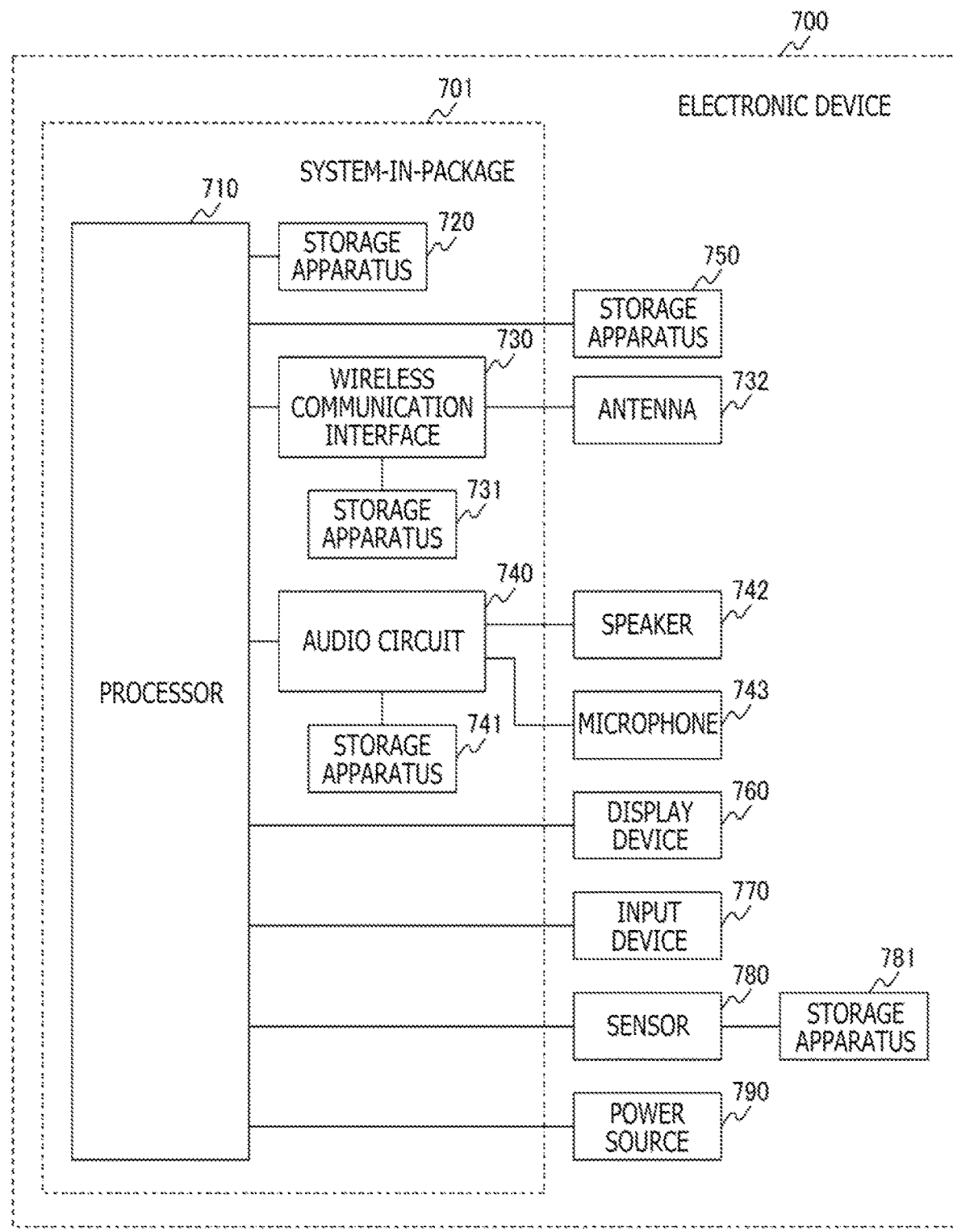
FIG. 25 is a diagram depicting an exemplary configuration of an electronic device 700 that uses the storage apparatus 100 embodying the present technology.

FIG. 25 is a diagram depicting an exemplary configuration of an electronic device 700 that uses the storage apparatus 100 embodying the present technology.

The electronic device 700 may presumably be a device such as a smartphone, a digital camera, a digital video camera, a music player, a set-top box, a computer, a TV set, a watch, an active speaker, a headset, a game console, a radio, a measuring instrument, an electronic tag, or a beacon. The electronic device 700 may be equipped with a power source 790, for example, as well as an interface such as an input device 770 and a display device 760.

The storage apparatus 100 may be connected to a storage apparatus 720 or 750 connected with a processor 710 incorporated in a system-in-package 701 (or system-on-chip).

A wireless communication interface 730 may have mobile communication, Wi-Fi (registered trademark), or short-range communication functions and may be connected with an antenna 732 and a resistance change storage apparatus 731.

An audio circuit 740 may have functions of controlling a speaker 742 and a microphone 743 and may be connected with a resistance change storage apparatus 741.

A sensor 780 may have functions of an optical sensor, a position sensor, an acceleration sensor, a biosensor, a magnetic sensor, a mechanical quantity sensor, a thermal sensor, an electrical sensor, or a chemical sensor, and may be connected with a resistance change storage apparatus 781.

The embodiments described above are merely examples in which the present technology may be implemented. The particulars of the embodiments correspond basically to the inventive matters claimed in the appended claims. Likewise, the inventive matters named in the appended claims correspond basically to the particulars of the embodiments with the same names in the foregoing description of the preferred embodiments of the present technology. However, these embodiments and other examples are not limitative of the present technology that may also be implemented using various modifications and alterations of the embodiments so far as they are within the scope of the appended claims.

The procedures described above in connection with the embodiments may be construed as constituting a method having a series of such procedures. Also, the procedures may be construed as forming a program for causing a computer to execute a series of such procedures, or as constituting a recording medium storing such a program. The recording medium may be a CD (Compact Disc), an MD (MiniDisc), a DVD (Digital Versatile Disc), a memory card, or a Blu-ray Disc (registered trademark), for example.

The advantageous effects stated in this description are only examples and not limitative of the present technology that may provide other advantages as well.

The present technology can also be implemented preferably in the following configurations.

(1)
A storage apparatus including:
a memory configured to store data in units of multiple cells each representing a predetermined value; and
a write control section configured such that, upon receipt of write-back data having a specific value in a position corresponding to at least one of the multiple cells, as well as a write-back command regarding the specific value, the write control section performs control to write the specific value only to a cell corresponding to the position indicative of the specific value in the write-back data.

(2)
The storage apparatus according to (1), in which each of the multiple cells includes a resistance change memory cell that stores any one of two binary values according to a resistance state of the cell.

(3)
The storage apparatus according to (2), in which the write control section performs control to let a current flow only to the cell corresponding to the position indicative of the specific value in the write-back data in a direction corresponding to the specific value, the write control section further performing control to prevent a current from flowing to the other cells by fixing the other cells to ground.

(4)
The storage apparatus according to (2), in which the write control section performs control to let a current flow only to the cell corresponding to the position indicative of the specific value in the write-back data in a direction corresponding to the specific value, the write control section further performing control to prevent a current from flowing to the other cells by fixing the other cells to high impedance.

(5)
The storage apparatus according to (2), in which the write control section performs control to let a current flow only to the cell corresponding to the position indicative of the specific value in the write-back data in a direction corresponding to the specific value, the write control section further performing control to prevent a current from flowing to the other cells by fixing the other cells to a power level.

(6)
The storage apparatus according to (2), in which
the write control section is divided into a first write control section and a second write control section symmetrical to each other across the memory interposed therebetween,
the first write control section performs control to let a current flow only to the cell corresponding to the position indicative of the specific value in the write-back data in a direction corresponding to the specific value, the first write control section further performing control to prevent a current from flowing to the other cells by fixing the other cells to a power level, and
the second write control section performs control to let a current flow only to the cell corresponding to the position indicative of the specific value in the write-back data in a direction corresponding to the specific value, the second write control section further performing control to prevent a current from flowing to the other cells by fixing the other cells to ground.

(7)

The storage apparatus according to (2), in which the write control section performs control to write the specific value in two cases on a time-sharing basis, one of the two cases involving any one of the two binary values being the specific value, the other case involving the other of the two binary values being the specific value.

(8)

The storage apparatus according to any one of (1) to (7), in which the data stored in the memory has information bits and check bits for checking the information bits.

(9)

The storage apparatus according to (8), further including:
a write-back command generation section configured to generate a correction bit position and the write-back command on the basis of the information bits and the check bits in the data read from the memory.

(10)

The storage apparatus according to (9), in which the write-back command generation section includes a check circuit and a correction circuit, the check circuit generating the correction bit position by checking whether or not a bit error is included in the data read from the memory on the basis of the information bits and the check bits in the read data, the correction circuit correcting the bit error and generating the write-back command on the basis of the data read from the memory and the correction bit position.

(11)

The storage apparatus according to (9), further including:
a write-back control section configured to generate the write-back data on the basis of the correction bit position and the write-back command.

(12)

The storage apparatus according to (11), further including:
a write-back information holding section configured to hold the correction bit position and the write-back command as write-back information, in which
the write-back control section generates the write-back data on the basis of the write-back information held in the write-back information holding section.

(13)

The storage apparatus according to any one of (8) to (12), in which
the memory is divided into a first memory and a second memory,
the first memory stores the information bits, and
the second memory stores the check bits.

(14)

A storage control apparatus including:
a write-back command generation section configured to generate a correction bit position and a write-back command regarding a specific value on the basis of information bits and check bits in data read from a memory, the write-back command generation section further outputting the write-back command to the memory; and
a write-back control section configured to generate write-back data having the specific value in a position corresponding to at least one of multiple bits on the basis of the correction bit position and the write-back command, the write-back control section further outputting the write-back data to the memory.

(15)

The storage control apparatus according to (14), further including:
a write-back information holding section configured to hold the correction bit position and the write-back command as write-back information, in which
the write-back control section generates the write-back data on the basis of the write-back information held in the write-back information holding section.

(16)

A storage apparatus control method including the steps of:
causing a write control section to receive write-back data and a write-back command regarding a specific value, the write-back data having the specific value in a position corresponding to at least one of multiple cells in a memory that stores data in units of the multiple cells each representing a predetermined value; and
causing the write control section to perform control to write the specific value only to the cell corresponding to the position indicative of the specific value in the write-back data.

(17)

A storage apparatus control method including the steps of:
causing a write-back command generation section to generate a correction bit position and a write-back command regarding a specific value on the basis of information bits and check bits in data read from a memory, the write-back command generation section being further caused to output the write-back command to the memory; and
causing a write-back control section to generate write-back data having the specific value in a position corresponding to at least one of multiple bits on the basis of the correction bit position and the write-back command, the write-back control section being further caused to output the write-back data to the memory.

REFERENCE SIGNS LIST

100: Storage apparatus
110: Memory array
111: Resistance change element
112: Switch
117: Source line
118: Bit line
119: Word line
120: Address control section
130: Command control section
140: Word selection section
150: Bit selection section
151, 152: Column switch
160: Write control section
161,162: Driver
163: NOT circuit
164: AND circuit
165: NOR circuit
166: XNOR circuit
167: AND circuit
168: OR circuit
169: NAND circuit
170: Readout control section
200: Storage control apparatus
210: Coding circuit
220: Write-back control section
221: OR circuit
222, 223: Selector
230: Check circuit

240: Correction circuit
241 to 243: Selector
250: Signal processing circuit
260: Write-back information holding section
261: Correction address holding section
262: Write-back direction holding section
263: Correction bit address holding section
264, 265: AND circuit
266: Address encoder
267: Address decoder
268: Selector

The invention claimed is:

1. A storage apparatus comprising:
   a memory configured to store data in units of multiple cells each representing a predetermined value; and
   a write control section configured such that, upon receipt of write-back data having a specific value in a position corresponding to at least one of the multiple cells, as well as a write-back command regarding the specific value, the write control section performs control to write the specific value only to a cell corresponding to the position indicative of the specific value in the write-back data.

2. The storage apparatus according to claim 1, wherein each of the multiple cells includes a resistance change memory cell that stores any one of two binary values according to a resistance state of the cell.

3. The storage apparatus according to claim 2, wherein the write control section performs control to let a current flow only to the cell corresponding to the position indicative of the specific value in the write-back data in a direction corresponding to the specific value, the write control section further performing control to prevent a current from flowing to the other cells by fixing the other cells to ground.

4. The storage apparatus according to claim 2, wherein the write control section performs control to let a current flow only to the cell corresponding to the position indicative of the specific value in the write-back data in a direction corresponding to the specific value, the write control section further performing control to prevent a current from flowing to the other cells by fixing the other cells to high impedance.

5. The storage apparatus according to claim 2, wherein the write control section performs control to let a current flow only to the cell corresponding to the position indicative of the specific value in the write-back data in a direction corresponding to the specific value, the write control section further performing control to prevent a current from flowing to the other cells by fixing the other cells to a power level.

6. The storage apparatus according to claim 2, wherein
   the write control section is divided into a first write control section and a second write control section symmetrical to each other across the memory interposed therebetween,
   the first write control section and the second write control section, respectively, perform control to let a current flow only to the cell corresponding to the position indicative of the specific value in the write-back data in a direction corresponding to the specific value,
   the first write control section further performing control to prevent a current from flowing to the other cells by fixing the other cells to a power level, and
   the second write control section further performing control to prevent a current from flowing to the other cells by fixing the other cells to ground.

7. The storage apparatus according to claim 2, wherein the write control section performs control to write the specific value in two cases on a time-sharing basis, one of the two cases involving any one of the two binary values being the specific value, the other case involving the other of the two binary values being the specific value.

8. The storage apparatus according to claim 1, wherein the data stored in the memory has information bits and check bits for checking the information bits.

9. The storage apparatus according to claim 8, further comprising:
   a write-back command generation section configured to generate a correction bit position and the write-back command on a basis of the information bits and the check bits in the data read from the memory.

10. The storage apparatus according to claim 9, wherein the write-back command generation section includes a check circuit and a correction circuit, the check circuit generating the correction bit position by checking whether or not a bit error is included in the data read from the memory on the basis of the information bits and the check bits in the read data, the correction circuit correcting the bit error and generating the write-back command on a basis of the data read from the memory and the correction bit position.

11. The storage apparatus according to claim 9, further comprising:
    a write-back control section configured to generate the write-back data on a basis of the correction bit position and the write-back command.

12. The storage apparatus according to claim 11, further comprising:
    a write-back information holding section configured to hold the correction bit position and the write-back command as write-back information, wherein
    the write-back control section generates the write-back data on a basis of the write-back information held in the write-back information holding section.

13. The storage apparatus according to claim 8, wherein
    the memory is divided into a first memory and a second memory,
    the first memory stores the information bits, and
    the second memory stores the check bits.

14. A storage control apparatus comprising:
    a write-back command generation section configured to generate a correction bit position and a write-back command regarding a specific value on a basis of information bits and check bits in data read from a memory, the write-back command generation section further outputting the write-back command to the memory; and
    a write-back control section configured to generate write-back data having the specific value in a position corresponding to at least one of multiple bits on a basis of the correction bit position and the write-back command, the write-back control section further outputting the write-back data to the memory.

15. The storage control apparatus according to claim 14, further comprising:
    a write-back information holding section configured to hold the correction bit position and the write-back command as write-back information, wherein
    the write-back control section generates the write-back data on a basis of the write-back information held in the write-back information holding section.

16. A storage apparatus control method comprising the steps of:
    causing a write control section to receive write-back data and a write-back command regarding a specific value, the write-back data having the specific value in a position corresponding to at least one of multiple cells in a memory that stores data in units of the multiple cells each representing a predetermined value; and causing the write control section to perform control to write the specific value only to the cell corresponding to the position indicative of the specific value in the write-back data.

17. A storage apparatus control method comprising the steps of:

causing a write-back command generation section to generate a correction bit position and a write-back command regarding a specific value on a basis of information bits and check bits in data read from a memory, the write-back command generation section being further caused to output the write-back command to the memory; and causing a write-back control section to generate write-back data having the specific value in a position corresponding to at least one of multiple bits on a basis of the correction bit position and the write-back command, the write-back control section being further caused to output the write-back data to the memory.

* * * * *